US012673889B2

(12) United States Patent
Kato et al.

(10) Patent No.: US 12,673,889 B2
(45) Date of Patent: Jul. 7, 2026

(54) PHOTOSENSITIVE GLASS

(71) Applicant: AGC Inc., Tokyo (JP)

(72) Inventors: Takeyuki Kato, Tokyo (JP); Yutaka Kuroiwa, Tokyo (JP); Nobuo Inuzuka, Shizuoka (JP); Hirofumi Yamamoto, Shizuoka (JP)

(73) Assignee: AGC Inc., Tokyo (JP)

( * ) Notice: Subject to any disclaimer, the term of this patent is extended or adjusted under 35 U.S.C. 154(b) by 427 days.

(21) Appl. No.: 18/520,651

(22) Filed: Nov. 28, 2023

(65) Prior Publication Data

US 2024/0101467 A1      Mar. 28, 2024

Related U.S. Application Data

(63) Continuation of application No. PCT/JP2022/021435, filed on May 25, 2022.

(30) Foreign Application Priority Data

Jun. 3, 2021      (JP) ................................. 2021-093783

(51) Int. Cl.
| | |
|---|---|
| *C03C 4/04* | (2006.01) |
| *C03B 32/02* | (2006.01) |
| *C03C 3/095* | (2006.01) |
| *C03C 15/00* | (2006.01) |
| *H05K 1/02* | (2006.01) |
| *H05K 1/03* | (2006.01) |

(52) U.S. Cl.
CPC ................ *C03C 4/04* (2013.01); *C03B 32/02* (2013.01); *C03C 3/095* (2013.01); *C03C 15/00* (2013.01); *H05K 1/0237* (2013.01); *H05K 1/0306* (2013.01); *C03C 2204/00* (2013.01)

(58) Field of Classification Search
None
See application file for complete search history.

(56) References Cited

U.S. PATENT DOCUMENTS

2008/0248250 A1      10/2008   Flemming et al.
2016/0340228 A1*     11/2016   Schreder ............... C03B 17/067
2020/0168976 A1*     5/2020    Popovich ............. H03H 7/0161

FOREIGN PATENT DOCUMENTS

CN            106746606 A   *   5/2017

* cited by examiner

*Primary Examiner* — Mohammad M Ameen
(74) *Attorney, Agent, or Firm* — Oblon, McClelland, Maier & Neustadt, L.L.P.

(57) ABSTRACT

The present invention relates to a photosensitive glass in which a $Li_2SiO_3$ crystal is precipitated by exposure and heat treatment, in which the photosensitive glass has a value of Formula (A) described below of 0.50 or more and 0.75 or less, and the photosensitive glass has a dielectric loss tangent at 20° C. and 10 GHz of 0.0090 or less, $[Li_2O]/([Li_2O]+[Na_2O]+[K_2O])$ Formula (A), in Formula (A), $[Li_2O]$, $[Na_2O]$, and $[K_2O]$ respectively indicate contents of $Li_2O$, $Na_2O$, and $K_2O$ in the photosensitive glass in terms of mole percentage based on oxides.

19 Claims, 9 Drawing Sheets

*FIG. 3*

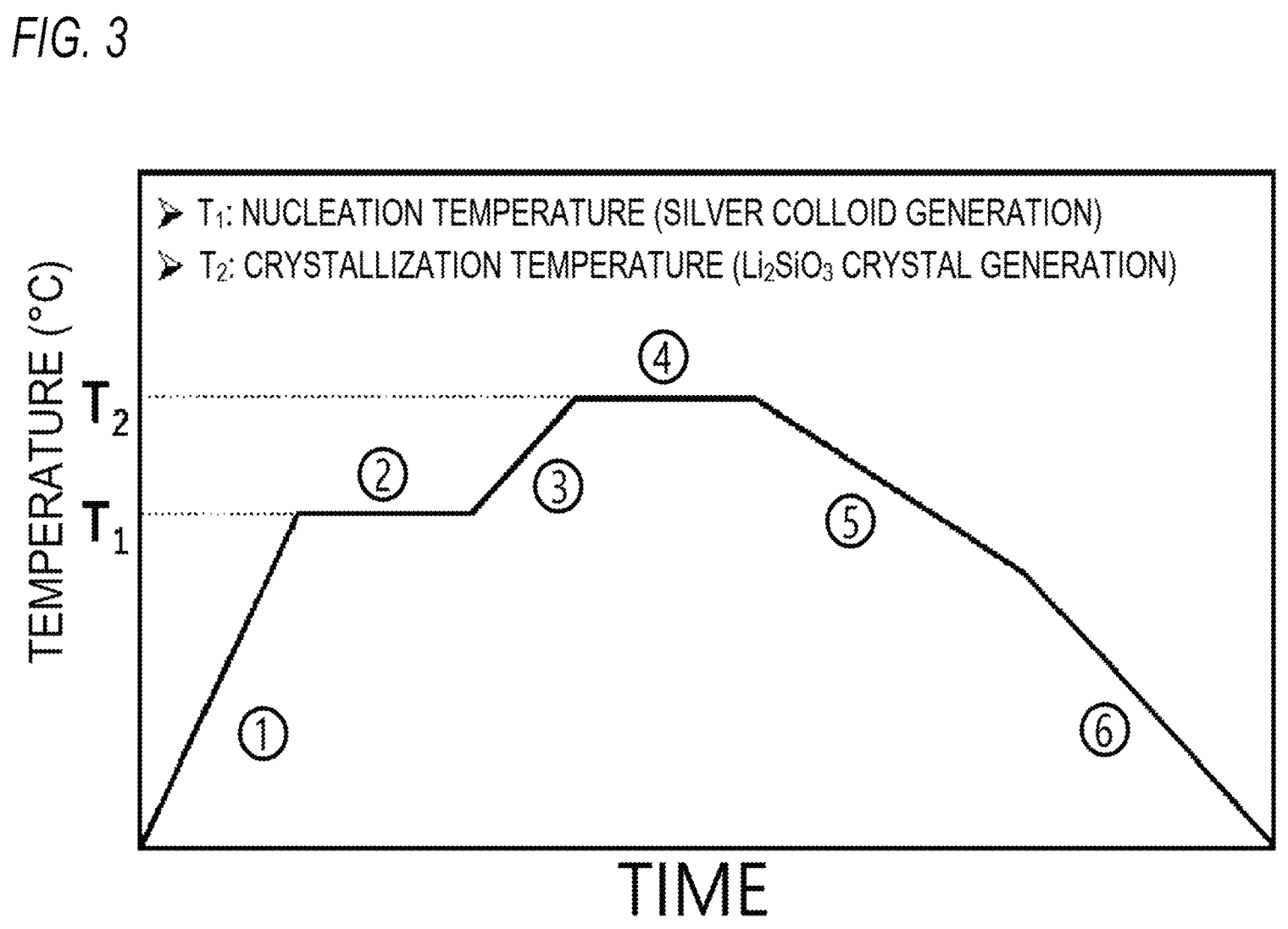

➤ T₁: NUCLEATION TEMPERATURE (SILVER COLLOID GENERATION)

➤ T₂: CRYSTALLIZATION TEMPERATURE (Li₂SiO₃ CRYSTAL GENERATION)

TEMPERATURE (°C)

$T_2$ $T_1$

TIME

PHOTOSENSITIVE GLASS

CROSS-REFERENCE TO RELATED APPLICATIONS

This is a continuation of International Application No. PCT/JP2022/021435 filed on May 25, 2022, and claims priority from Japanese Patent Application No. 2021-093783 filed on Jun. 3, 2021, the entire content of which is incorporated herein by reference.

TECHNICAL FIELD

The present invention relates to photosensitive glass, and particularly to photosensitive glass that has good dielectric properties in a high-frequency band such as the 5G region and that can be microfabricated by crystallization and etching through exposure and heat treatment.

BACKGROUND ART

In recent years, wireless transmission using a high-frequency band such as a microwave band or a millimeter wave band has attracted attention as a large-capacity transmission technique. However, it is known that a dielectric loss during the wireless transmission is proportional to a frequency and a dielectric loss tangent of a dielectric substrate. Therefore, as a signal frequency increases with expansion of a frequency to be used, a dielectric substrate having a particularly low dielectric loss tangent is required in the high-frequency band.

On the other hand, when a device of a component for high-frequency is assumed, high dimensional accuracy and precise structure control are also required for a substrate used. This is due to various reasons such as a problem in a package process of each component and miniaturization of a module. Therefore, it is also required to microfabrication property of a material per se.

In the related art, quartz, ceramics, glass, and the like are used as a material of the dielectric substrate. However, these materials have relatively good dielectric properties but are often insufficient in a microfabrication property.

Here, a photosensitive glass is known as glass having a very good microfabrication property among glass. The photosensitive glass can be microfabricated by a very simple processing process, as disclosed in, for example, Patent Literature 1.

CITATION LIST

Patent Literature

Patent Literature 1: U.S. Patent Publication No. 2008/0248250

SUMMARY OF INVENTION

Technical Problem

However, the photosensitive glass in the related art was not considered to be used as a material of a component for high-frequency, and thus the dielectric properties have not been considered, and the dielectric loss tangent has been relatively high. Therefore, the photosensitive glass in the related art is excellent in the microfabrication property but has a problem in which the dielectric loss becomes large when it is assumed to be used in a high-frequency band.

In order to solve the above problems, an object of the present invention is to provide a photosensitive glass that does not impair the microfabrication property while improving the dielectric properties of the glass per se.

Solution to Problem

The present inventors have intensively studied to solve the above problems. As a result, the present inventors have found that the above-described problems can be solved by the following configurations.

[1] A photosensitive glass in which a $Li_2SiO_3$ crystal is precipitated by exposure and heat treatment, in which the photosensitive glass has a value of Formula (A) described below of 0.50 or more and 0.75 or less, and the photosensitive glass has a dielectric loss tangent at 20° C. and 10 GHz of 0.0090 or less, $$[Li_2O]/([Li_2O]+[Na_2O]+[K_2O]) \qquad \text{Formula (A)},$$

in Formula (A), $[Li_2O]$, $[Na_2O]$, and $[K_2O]$ respectively indicate contents of $Li_2O$, $Na_2O$, and $K_2O$ in the photosensitive glass in terms of mole percentage based on oxides.

[2] The photosensitive glass according to [1], including:
65% to 78% of $SiO_2$ in terms of mass percentage based on oxides, in which
the photosensitive glass has a glass portion etching rate obtained by Formula (1) described below of 2.75 or less when a glass sample having a length of 30 mm×a width of 20 mm and a thickness of 0.5 mmt is immersed in 55 ml of an etching solution at 40° C. containing 5 mass % of HT and 0.7 mass % of $HNO_3$ for 4 minutes.

[Math. 1]

$$\text{etching rate } \left(\frac{\mu m}{min}\right) = \frac{\text{weight loss } (g) \times \text{thickness of glass before testing } (\mu m)}{\text{weight of glass before testing } (g) \times \text{test time } (min)}. \qquad (1)$$

[3] The photosensitive glass according to [1] or [2], including, in terms of mass percentage based on oxides:
0% to 5% (not including 5%) of $Al_2O_3$;
5% to 15% of $Li_2O$;
3% to 12% of $Na_2O$;
3% to 12% of $K_2O$;
0.3% to 8% of $ZnO$;
0.01% to 1% (not including 1%) of $Sb_2O_3$;
0.001% to 0.1% of $CeO_2$; and
0.05% to 1% of $Ag_2O$.
[4] The photosensitive glass according to [1] or [2], including, in terms of mass percentage based on oxides:
0% to 5% (not including 5%) of $Al_2O_3$;
5% to 15% of $Li_2O$;
3% to 12% of $Na_2O$;
3% to 12% of $K_2O$;
0% to 8% of $ZnO$;
0.01% to 1% (not including 1%) of $Sb_2O_3$;
0.001% to 0.1% of $CeO_2$; and
0.05% to 1% of $Ag_2O$.
[5] The photosensitive glass according to any one of [1] to [4], including:
0% to 8% of $B_2O_3$ in terms of mass percentage based on oxides.
[6] The photosensitive glass according to any one of [1] to [5], having a relative permittivity at 20° C. and 10 GHz of 7.5 or less.

[7] A glass in which a $Li_2SiO_3$ crystal is precipitated by exposing and heat-treating the photosensitive glass according to any one of [1] to [6].

[8] A glass in which a microstructure is formed by exposing, heat-treating, and etching the photosensitive glass according to any one of [1] to [6].

[9] A circuit substrate including an insulating substrate containing the glass according to [8].

[10] The circuit substrate according to [9], which is used for a high-frequency device.

[11] The circuit substrate according to [10], including a transmission line.

[12] The circuit substrate according to [11], in which the transmission line is a waveguide, a substrate integrated waveguide (SIW), or a microstrip line.

[13] The circuit substrate according to [11], having a function of a passive device.

[14] A high-frequency device including the circuit substrate according to any one of [9] to [13].

[15] A manufacturing method of a glass in which a microstructure is formed, the method including:

a step of exposing the photosensitive glass according to any one of [1] to [6];

a step of precipitating a $Li_2SiO_3$ crystal by heat-treating the exposed photosensitive glass; and a step of removing the precipitated $Li_2SiO_3$ crystal by etching treatment.

[16] The manufacturing method according to [15], in which the heat treatment includes holding in a first temperature range and holding in a second temperature range, the first temperature range is 400° C. or higher and 500° C. or lower, and a holding time in the first temperature range is 15 minutes or longer, and the second temperature range is 500° C. or higher and 700° C. or lower, and a holding time in the second temperature range is 15 minutes or longer.

[17] The manufacturing method according to [15], in which the heat treatment includes holding in a first temperature range and holding in a second temperature range, the first temperature range is 400° C. or higher and 600° C. or lower, and a holding time in the first temperature range is 1 minute or longer, and the second temperature range is (the first temperature range+5° C.) or higher and (the first temperature range+ 300° C.) or lower, and a holding time in the second temperature range is 1 minute or longer.

[18] The photosensitive glass according to any one of [1] to [6], having a transmittance (1 mmt converted value) at 430 nm of 4% or more when exposed at an exposure amount of 0.5 $J/cm^2$ and heat-treated at 485° C. for 5 hours.

[19] The photosensitive glass according to any one of [1] to [6], in which regarding a transmittance (1 mmt converted value) at 430 nm measured when exposed at an exposure amount of 1 $J/cm^2$ to 10 $J/cm^2$ and heat-treated at 485° C. for 5 hours, when plotted on a coordinate plane in which the exposure amount is set as a horizontal axis ($J/cm^2$) and the transmittance is set as a vertical axis (%), a slope of the transmittance (1 mmt converted value) at 430 nm, which is obtained by Formula (4) described below, is −0.12 or less with respect to the exposure amount of 1 $J/cm^2$ to 10 $J/cm^2$.

[Math. 2]

$$slope = \frac{\sum(X - \text{sample average of } X)(Y - \text{sample average of } Y)}{\sum(X - \text{sample average of } X)^2} \quad (4)$$

X: exposure amount ($J/cm^2$), Y: transmittance (1 mmt converted value) at 430 nm

Advantageous Effects of Invention

The present invention provides photosensitive glass having a small dielectric loss in a high-frequency band and an excellent microfabrication property and a manufacturing method thereof, a circuit substrate including the photosensitive glass, and a high-frequency device.

BRIEF DESCRIPTION OF DRAWINGS

FIG. 3 is a diagram schematically showing a temperature change in a two-stage heat treatment performed on photosensitive glass of Example.

DESCRIPTION OF EMBODIMENTS

Figure 1:
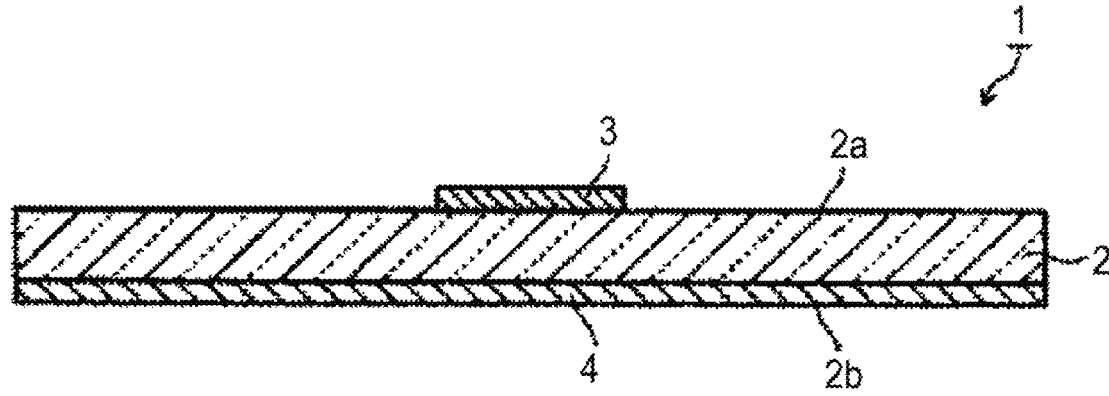
FIG. 1 is a cross-sectional view illustrating a circuit substrate according to an embodiment of the present invention.

In the present description, unless otherwise specified, "to" indicating a numerical range is used in the sense of including the numerical values set forth before and after the "to" as a lower limit value and an upper limit value.

In the present description, a glass composition is expressed in terms of mass percentage based on oxides unless otherwise specified, and mass % is simply expressed as "%". In Formula (A), [$Li_2O$], [$Na_2O$], and [$K_2O$] are expressed in mole percentage based on oxides.

In the present description, a "high frequency" indicates a frequency of 1 GHz or more. The "high frequency" indicates preferably 5 GHz or more, more preferably 10 GHz or more, further preferably 20 GHz or more, particularly preferably 28 GHz or more, and most preferably 35 GHz or more. For example, the "high frequency" is 100 GHz or less.

In the present description, "photosensitive glass" refers to glass that can be microfabricated by a combination of crystallization by heat treatment and exposure, and etching. In particular, the photosensitive glass of the present invention is characterized in that a $Li_2SiO_3$ crystal is precipitated by exposure and heat treatment and is removed by etching.

More specifically, the "photosensitive glass" causes a chemical reaction upon exposure, and $Ag^+$ ions contained in the photosensitive glass receive electrons to become metal atoms. After that, the photosensitive glass is heat-treated to generate a silver colloid, and by heat-treating at a higher temperature, the $Li_2SiO_3$ crystal is formed and precipitated with the silver colloid as a nucleus. Since this precipitated $Li_2SiO_3$ crystal has a very large solubility in HF, exposed portions can be selectively removed by HF etching.

Since the glass causes a chemical reaction upon exposure, the glass is called photosensitive glass.

The $Li_2SiO_3$ crystal described above can be identified by, for example, X-ray diffraction measurement (XRD). Specifically, in the case where a peak having the highest intensity is confirmed in a range of $2\theta=26.5°$ to $27.5°$ when measured by XRD using CuKα rays at $2\theta=10°$ to $90°$, the crystallized glass includes the $Li_2SiO_3$ crystal.

In the present description, a "glass portion etching rate" means an etching rate (unexposed portion etching rate) of an unexposed glass portion (glass portion).

In the present description, an "exposed portion/unexposed portion etching rate selectivity" means a ratio obtained by dividing an etching rate (exposed portion etching rate) of a portion crystallized by exposure by the etching rate (unexposed portion etching rate) of the unexposed glass portion (glass portion). This indicates that the higher the exposed portion/unexposed portion etching rate selectivity, the more selectively the exposed portion can be removed, and conversely, the lower the exposed portion/unexposed portion etching rate selectivity, the more easily an unexposed glass portion is etched.

Photosensitive Glass

The photosensitive glass according to an embodiment of the present invention is the photosensitive glass in which the $Li_2SiO_3$ crystal is precipitated by exposure and heat treatment and is characterized in that a value of Formula (A) described below is 0.50 or more and 0.75 or less, and a dielectric loss tangent at 20° C. and 10 GHz is 0.0090 or less.

$$[Li_2O]/([Li_2O]+[Na_2O]+[K_2O]) \qquad \text{Formula (A)}$$

(In Formula (A), $[Li_2O]$, $[Na_2O]$, and $[K_2O]$ respectively indicate contents of $Li_2O$, $Na_2O$, and $K_2O$ in the photosensitive glass in terms of mole percentage based on oxides.)

In the photosensitive glass of the present embodiment, the above Formula (A) is an index representing a degree of mixing of alkali metal atoms, and the smaller the value of Formula (A), the more alkali metal atoms are mixed. In the case where the value of Formula (A) is 0.75 or less, the dielectric loss tangent at 20° C. and 10 GHz becomes a favorable value.

The value of Formula (A) is, in the following preferred order, 0.74 or less, 0.73 or less, 0.72 or less, 0.71 or less, 0.69 or less, 0.68 or less, 0.67 or less, 0.66 or less, 0.65 or less, 0.64 or less, 0.63 or less, 0.62 or less, 0.61 or less, and 0.60 or less.

On the other hand, in the case where the value of Formula (A) becomes too small, a ratio of $Li_2O$ in the glass decreases, making it difficult for the $Li_2SiO_3$ crystal to be precipitated. In addition, in the case where the value of Formula (A) becomes too small, an etching rate of the glass determined by Formula (1) described later increases, resulting in a problem that the exposed portion/unexposed portion etching rate selectivity deteriorates. Therefore, the value of Formula (A) is 0.50 or more, and is, in the following preferred order, 0.51 or more, 0.52 or more, 0.53 or more, 0.54 or more, 0.55 or more, and 0.56 or more.

In addition, as described above, the photosensitive glass of the present embodiment has excellent dielectric properties in a high-frequency region due to an alkali mixing effect by containing a plurality of alkali metal atoms, and the dielectric loss tangent at 20° C. and 10 GHz is 0.0090 or less. The dielectric loss tangent is preferably 0.0089 or less, more preferably 0.0088 or less, further preferably 0.0087 or less, yet more preferably 0.0086 or less, and particularly preferably 0.0085 or less.

The dielectric loss tangent is measured by a split post dielectric resonator method (SPDR method).

Composition

A glass composition for realizing the photosensitive glass of the present embodiment will be described below.

The composition of the photosensitive glass of the embodiment of the present invention is not particularly limited as long as the glass satisfies Formula (A) and a range of the dielectric loss tangent, and for example, preferably includes 65% to 78% of $SiO_2$, 5% to 15% of $Li_2O$, and 0.05% to 1% of $Ag_2O$ in terms of mass percentage based on oxides. Here, $SiO_2$ and $Li_2O$ are components constituting the $Li_2SiO_3$ crystal, and $Ag_2O$ is a component forming a nucleus of the crystal.

It is preferable that the photosensitive glass of the present embodiment includes, in terms of mass percentage based on oxides, 0% to 5% (not including 5%) of $Al_2O_3$, 3% to 12% of $Na_2O$, 3% to 12% of $K_2O$, 0.3% to 8% of ZnO, 0.01% to 1% (not including 1%) of $Sb_2O_3$, and 0.001% to 0.1% of $CeO_2$.

It is preferable that the photosensitive glass of the present embodiment includes, in terms of mass percentage based on oxides, 0% to 5% (not including 5%) of $Al_2O_3$, 3% to 12% of $Na_2O$, 3% to 12% of $K_2O$, 0% to 8% of ZnO, 0.01% to 1% (not including 1%) of $Sb_2O_3$, and 0.001% to 0.1% of $CeO_2$.

$Al_2O_3$ is a component that is effective in improving an acid resistance, improving a Young's modulus, improving phase separation property of glass, reducing a coefficient of thermal expansion, and the like.

$Na_2O$ and $K_2O$ are components that, when mixed with $Li_2O$, make the dielectric loss tangent lower by expression the alkali mixing effect.

ZnO is a component that increases a solubility of $Ag_2O$.

$Sb_2O_3$ is a thermally reducible component and is a component that reduces metal ions during the heat treatment.

$CeO_2$ is an optical sensitizer and is a component that makes a material exposed only to high-energy light such as X-rays become sensitive to ultraviolet light.

Hereinafter, each component will be described in detail.

$SiO_2$ is a component for forming and precipitating the $Li_2SiO_3$ crystal as a crystal phase. In the photosensitive glass of the present embodiment, a content of $SiO_2$ is preferably 65% or more. In the case where the content of $SiO_2$ is 65% or more, the precipitated crystal phase of the crystallized glass is easily stabilized.

The content of $SiO_2$ is more preferably 67% or more, further preferably 68% or more, even further preferably 69% or more, particularly preferably 69.5% or more, yet more preferably 70% or more, and most preferably 70.5% or more.

In addition, in the photosensitive glass of the present embodiment, the content of $SiO_2$ is preferably 78% or less. In the case where the content of $SiO_2$ is 78% or less, it is easy to melt or mold a glass raw material. In the case where the content of $SiO_2$ is too large, a $Li_2Si_2O_5$ crystal, which is another crystal, is likely to be precipitated, and it is difficult to remove the $Li_2Si_2O_5$ crystal by etching treatment in comparison to $Li_2SiO_3$ crystal, which is not preferable. In addition, heat treatment conditions are also an important factor in order to precipitate the $Li_2SiO_3$ crystal as the crystal phase, and a wider range of the heat treatment conditions can be selected by setting the content of $SiO_2$ to be equal to or less than the above upper limit.

The content of $SiO_2$ is more preferably 76% or less, further preferably 75% or less, even further preferably 74% or less, particularly preferably 73.5% or less, and most preferably 73% or less.

$Li_2O$ is a component for forming and precipitating the $Li_2SiO_3$ crystal. In addition, the photosensitive glass of the present embodiment can reduce the dielectric loss tangent at 10 GHz by the alkali mixing effect obtained by mixing a plurality of alkali metal atoms such as $Na_2O$ and $K_2O$ in addition to $Li_2O$.

In addition, the photosensitive glass of the present embodiment can reduce an electrical conductivity due to the alkali mixing effect. For example, when wiring copper or the like to a glass substrate, insulating properties between the substrate and the wiring are important, and the reduction in the electrical conductivity due to the alkali mixing effect can contribute to improving the insulating properties of the glass substrate.

Specifically, in the photosensitive glass of the present embodiment, the content of $Li_2O$ as well as $Na_2O$ and $K_2O$, which will be described later, is adjusted so that the value of Formula (A) described below is 0.50 or more and 0.75 or less.

$$[Li_2O]/([Li_2O]+[Na_2O]+[K_2O]) \quad \text{Formula (A)}$$

(In Formula (A), $[Li_2O]$, $[Na_2O]$, and $[K_2O]$ respectively indicate contents of $Li_2O$, $Na_2O$, and $K_2O$ in the photosensitive glass in terms of mole percentage based on oxides.)

In the photosensitive glass of the present embodiment, the content of $Li_2O$ (in terms of mass percentage based on oxides) is preferably 5% or more. In the case where the content of $Li_2O$ is 5% or more, a desired crystal is easily obtained, and the precipitated crystal phase is easily stabilized.

The content of $Li_2O$ is, in the following preferred order, 5.2% or more, 5.4% or more, 5.6% or more, 5.8% or more, 6.0% or more, 6.2% or more, 6.4% or more, 6.6% or more, 6.8% or more, and 7% or more.

On the other hand, in the case where the content $Li_2O$ is too large, an influence of the alkali mixing effect becomes small, and thus the content of $Li_2O$ (mass percentage based on oxides) is preferably 15% or less. In the case where the content of $Li_2O$ is 15% or less, the desired crystal is easily obtained, and the precipitated crystal phase is easily stabilized.

The content of $Li_2O$ is, in the following preferred order, 13% or less, 12% or less, 11.5% or less, 11% or less, 10.5% or less, 10% or less, 9.8% or less, 9.6% or less, 9.4% or less, 9.2% or less, 9.0% or less, 8.8% or less, 8.6% or less, 8.4% or less, 8.2% or less, and 8.0% or less.

In the photosensitive glass of the present embodiment, the content of $Na_2O$ (in terms of mass percentage based on oxides) is preferably 3% or more. In the case where $Na_2O$ is 3% or more, the alkali mixing effect can be obtained, and the dielectric loss tangent at 10 GHz can be reduced.

The content of $Na_2O$ is more preferably 3.1% or more, further preferably 3.2% or more, even further preferably 3.3% or more, particularly preferably 3.4% or more, yet more preferably 3.5% or more, and most preferably 3.6% or more.

In addition, the content of $Na_2O$ (in terms of mass percentage based on oxides) is preferably 12% or less. In the case where the amount of $Na_2O$ is excessively large, there is a high possibility that Na replaces the Li site of the $Li_2SiO_3$ crystal. As a result, it is expected that the $Li_2SiO_3$ crystal is hardly precipitated.

The content of $Na_2O$ is more preferably 11.8% or less, further preferably 11.6% or less, even further preferably 11.4% or less, particularly preferably 11.2% or less, yet more preferably 11% or less, and most preferably 10.8% or less.

In the photosensitive glass of the present embodiment, the content of $K_2O$ (in terms of mass percentage based on oxides) is preferably 3% or more. In the case where $K_2O$ is 3% or more, the good alkali mixing effect can be obtained, and the dielectric loss tangent at 20° C. and 10 GHz can be reduced. Furthermore, a tendency for devitrification during glass manufacturing can be reduced.

The content of $K_2O$ is more preferably 3.1% or more, further preferably 3.2% or more, even further preferably 3.3% or more, particularly preferably 3.4% or more, yet more preferably 3.5% or more, and most preferably 3.6% or more.

In addition, the content of $K_2O$ (in terms of mass percentage based on oxides) is preferably 12% or less. In the case where the content of $K_2O$ is 12% or less, an increase in the etching rate of the glass portion can be prevented, and a decrease in the exposed portion/unexposed portion etching rate selectivity can be prevented. As a result, selective HF etching can be performed, and desired microfabrication can be achieved. In the case where the amount of $K_2O$ is excessively large, there is a high possibility that K replaces the Li site of the $Li_2SiO_3$ crystal. As a result, it is expected that the $Li_2SiO_3$ crystal is hardly precipitated.

The content of $K_2O$ is more preferably 11.8% or less, further preferably 11.6% or less, even further preferably 11.4% or less, particularly preferably 11.2% or less, yet more preferably 11% or less, and most preferably 10.8% or less.

$Al_2O_3$ is a component that is effective in improving the acid resistance, improving the Young's modulus, improving the phase separation property of glass, reducing the coefficient of thermal expansion, and the like. In the case where the photosensitive glass of the present embodiment includes $Al_2O_3$, the content of $Al_2O_3$ is more preferably 0.2% or more, further preferably 0.4% or more, even further preferably 0.6% or more, particularly preferably 0.8% or more, yet more preferably 1% or more, and most preferably 1.2% or more.

Meanwhile, $Al_2O_3$ may deteriorate the dielectric loss tangent in the high-frequency region. In the case where the content of $Al_2O_3$ is less than 5%, the dielectric loss tangent in the high-frequency region can be further reduced. The content of $Al_2O_3$ is preferably 4.5% or less, more preferably 4% or less, and further preferably 3.5% or less.

The photosensitive glass of the present embodiment includes a photosensitive agent component. The photosensitive agent component is a component capable of generating a nucleus serving as a starting point of crystal growth to selectively crystallize the exposed portion. That is, by containing the photosensitive agent component, the glass can be selectively removed. Examples of the photosensitive agent component include, for example, $Ag^+$, $Au^+$, $Cu^+$, and the like. Among these examples of the photosensitive agent, $Ag^+$ is referable because $Ag^+$ has no absorption in a visible region, is easily dissolved in glass (high solubility), and is low in raw material cost.

$Ag_2O$ functions as the photosensitive agent component as described above. The present inventors have found that as a content of silver in glass increases, an exposure sensitivity of silver colloid generation decreases. At first glance, it seems that a higher exposure sensitivity is preferable, but in the case where the exposure sensitivity is too high, problems arise such as undesired portions reacting to the exposure to generate the silver colloid. That is, it is necessary to reduce the exposure sensitivity by containing a predetermined amount of sliver.

$Ag_2O$ is also a component serving as a crystal nucleus source. In the case where an amount of the nucleus source in the glass is relatively large, a large number of finely distributed small nuclei bring about a finer crystal arrangement than a smaller number of nuclei in the same glass volume. As a result, a size of the formed crystal is reduced, and the etching is performed more rapidly at a crystal grain boundary.

In the case where the content of $Ag_2O$ is small, the size of the $Li_2SiO_3$ crystal tends to increase. As a result, it is expected that a surface state after etching is easily roughened. In the case where a sample surface is rough, a problem in a package process occurs when the sample is used as a substrate.

For the above reasons, in the photosensitive glass of the present embodiment, the content of $Ag_2O$ is preferably 0.05% or more. The content of $Ag_2O$ is, in the following preferred order, 0.055% or more, 0.06% or more, 0.065% or more, 0.07% or more, 0.075% or more, 0.08% or more, 0.085% or more, 0.09% or more, 0.095% or more, and 0.10% or more.

On the other hand, the content of $Ag_2O$ is preferably 1% or less. In the case where the content of $Ag_2O$ is 1% or less, a dissolution residue of $Ag_2O$ in the glass can be prevented. In addition, it is not preferable to increase the content of $Ag_2O$ too much for a reason that when $Ag_2O$ is added at a high concentration, $Ag_2O$ has a bad influence on melting equipment, and $Ag_2O$ per se is expensive as a raw material. In addition, the silver colloid generation is not determined only by the amount of $Ag_2O$ and is affected by other components, and thus there is no point in increasing only the amount of $Ag_2O$ blindly.

The content of $Ag_2O$ is, in the following preferred order, 0.90% or less, 0.80% or less, 0.70% or less, 0.60% or less, 0.55% or less, 0.50% or less, 0.45% or less, 0.40% or less, 0.35% or less, and 0.30% or less.

$CeO_2$ is an optical sensitizer and makes a material exposed only to high-energy light such as X-rays become sensitive to ultraviolet light. In addition, in the photosensitive glass of the present embodiment, $CeO_2$ plays a role of emitting electrons through receiving ultraviolet rays, and supplying the electrons to $Ag^+$ ions.

In the photosensitive glass of the present embodiment, a content of $CeO_2$ is preferably 0.001% or more. In the case where the content of $CeO_2$ is 0.001% or more, an effect of reducing $Ag^+$ ions can be stably achieved against exposure.

The content of $CeO_2$ is more preferably 0.004% or more, further preferably 0.006% or more, even further preferably 0.008% or more, particularly preferably 0.01% or more, yet more preferably 0.012% or more, and most preferably 0.014% or more.

On the other hand, the content of $CeO_2$ is preferably 0.1% or less. In the case where the content of $CeO_2$ is 0.1% or less, a sensitivity to exposure does not become too high, problems such as unnecessary portions being exposed can be avoided, and the microfabrication property can be controlled.

The content of $CeO_2$ is more preferably 0.09% or less, further preferably 0.085% or less, even further preferably 0.08% or less, yet more preferably 0.075%, and most preferably 0.07%.

$Sb_2O_3$ is a thermally reducible component and reduces the metal ions during the heat treatment. In the photosensitive glass of the present embodiment, $Sb_2O_3$ serves to reduce $Ag^+$ ions in a high temperature range.

In the photosensitive glass of the present embodiment, a content of $Sb_2O_3$ is preferably 0.01% or more. In the case where the content of $Sb_2O_3$ is 0.01% or more, it is possible to stably reduce the metal ions during the heat treatment.

The content of $Sb_2O_3$ is more preferably 0.05% or more, further preferably 0.07% or more, even further preferably 0.09% or more, particularly preferably 0.11% or more, yet more preferably 0.13% or more, and most preferably 0.15% or more.

On the other hand, since a coloring rate of the glass greatly changes according to the content of $Sb_2O_3$, in the case where the concentration is too high, a color of the glass becomes dark, which is not preferable. In addition, $Sb_2O_3$ is designated as a "Group-2 Substance" and a "Specified Chemical Substance", and according to Article 2-2 of Specified Chemical Substance Hazard Prevention Ordinance (Specialized Regulations), a substance having an $Sb_2O_3$ content of more than 1% is a regulation subject as a specified chemical substance. Therefore, it is preferable that the content of $Sb_2O_3$ is less than 1%.

The content of $Sb_2O_3$ is more preferably 0.9% or less, further preferably 0.85% or less, even further preferably 0.8% or less, yet more preferably 0.75% or less, and most preferably 0.7% or less.

In the case where it is desired to increase a thermal expansion coefficient of the glass, ZnO does not necessarily need to be included. On the other hand, ZnO increases the solubility of $Ag_2O$. Further, ZnO may exhibit effects such as improving chemical durability and preventing undesired reduction of silver. Therefore, in the photosensitive glass of the present embodiment, the content of ZnO is, in the preferred order, 0% or more, 0.1% or more, 0.2% or more, 0.3% or more, 0.4% or more, 0.5% or more, 0.52% or more, 0.54% or more, 0.56% or more, 0.58% or more, 0.60% or more, 0.62% or more, 0.64% or more, 0.66% or more, 0.68% or more, and 0.7% or more.

On the other hand, in the case where the content of ZnO is high, a crystallization tendency is reduced more than desired. Therefore, it is preferable that the content of ZnO is 8% or less. The content of ZnO is more preferably 7.5% or less, further preferably 7% or less, even further preferably 6.5% or less, particularly preferably 6% or less, yet more preferably 5.5% or less, and most preferably 5% or less.

The photosensitive glass of the present embodiment may include $B_2O_3$. $B_2O_3$ is a component that is effective in improving the dielectric properties such as a relative permittivity and a dielectric loss tangent in a high-frequency region, and improving solubility. $B_2O_3$ is also effective as a nucleating agent.

In the case where the photosensitive glass of the present embodiment includes $B_2O_3$, the content of $B_2O_3$ is more preferably 0.1% or more, further preferably 0.2% or more, even further preferably 0.3% or more, particularly preferably 0.4% or more, and most preferably 0.5% or more.

On the other hand, in the case where the content of $B_2O_3$ is large, problems such as deterioration of the chemical durability of the glass and difficulty in precipitation of $Li_2SiO_3$ crystals occur. Therefore, the content of $B_2O_3$ is preferably 8% or less, and is, in the following preferred order, 7% or less, 6% or less, 5% or less, 4% or less, 3% or less, and 2% or less.

Other components can be included as long as the performance of the glass is not impaired. Examples of other components include, for example, $Rb_2O$, $Cs_2O$, MgO, CaO, SrO, BaO, $P_2O_5$, $GeO_2$, $Sc_2O_3$, $Y_2O_3$, $La_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $TiO_2$, $V_2O_5$, $Cr_2O_3$, $MnO_2$, $Fe_2O_3$, CoO, NiO, $ZrO_2$, $Nb_2O_5$, $MoO_3$, $HfO_2$, $Ta_2O_3$, and $WO_3$.

A content of these components is preferably 5% or less, more preferably 4% or less, further preferably 3%, even further preferably 2% or less, particularly preferably 1% or less, even more preferably 0.5% or less, and most preferably 0.1% or less.

Physical Properties

The photosensitive glass of the present embodiment contains a plurality of alkali metal atoms as described above and thus has excellent dielectric properties in the high-frequency region due to the alkali mixing effect. By setting the content of $Al_2O_3$ in a predetermined range, the photosensitive glass of the present embodiment is excellent in the dielectric properties in the high-frequency region. In the photosensitive glass of the present embodiment, in the case where the dielectric loss tangent at 20° C. and 10 GHz is within the above preferable ranges, it is considered that the dielectric properties for a band of a frequency higher than 10 GHz are also excellent.

The dielectric loss tangent at 20° C. and 10 GHz of the photosensitive glass of the present embodiment is 0.0090 or less from the viewpoint of improving the dielectric properties as described above. The dielectric loss tangent is preferably 0.0089 or less, more preferably 0.0088 or less, further preferably 0.0087 or less, yet more preferably 0.0086 or less, and particularly preferably 0.0085 or less. A lower limit is not particularly limited, and is preferably, for example, 0.0005 or more.

The relative permittivity at 20° C. and 10 GHz of the photosensitive glass of the present embodiment is, from the viewpoint of improving the dielectric properties, preferably 7.5 or less, more preferably 7.4 or less, further preferably 7.3 or less, yet more preferably 7.2 or less, particularly preferably 7.1 or less, and most preferably 7.0 or less. A lower limit is not particularly limited, and is preferably, for example, 3 or more.

The dielectric loss tangent and the relative permittivity are measured by the split post dielectric resonator method (SPDR method).

In the photosensitive glass of the present embodiment, the glass portion etching rate is, from the viewpoint of improving the microfabrication property, preferably 2.75 or less, more preferably 2.70 or less, further preferably 2.65 or less, yet more preferably 2.60 or less, more yet more preferably 2.55 or less, further yet more preferably 2.50 or less, particularly preferably 2.45 or less, and most preferably 2.40 or less. In the case where the glass portion etching rate is too high, the glass portion is cut more than necessary during etching, and it becomes difficult to control the microfabrication property. A lower limit is not particularly limited, and is preferably, for example, 0.1 or more.

A calculation method of the glass portion etching rate is as follows. A glass sample having a length of 30 mm×a width of 20 mm and a thickness of 0.5 mmt is immersed in 55 ml of an etching solution at 40° C. containing 5 mass % of HF and 0.7 mass % of $HNO_3$ for 4 minutes. At this time, a value obtained by Formula (1) described below is the glass portion etching rate.

[Math. 3]

$$\text{etching rate } \left(\frac{\mu m}{min}\right) = \frac{\text{weight loss } (g) \times \text{thickness of glass before testing } (\mu m)}{\text{weight of glass before testing } (g) \times \text{test time (min)}} \quad (1)$$

In the photosensitive glass of the present embodiment, the exposed portion/unexposed portion etching rate selectivity represented by Formula (2) described below is preferably a larger value. The exposed portion/unexposed portion etching rate selectivity is calculated based on Formula (2) described below by obtaining an etching rate (exposed portion etching rate) when the glass that is exposed and heat-treated is etched and an etching rate (unexposed portion etching rate) when the glass that is not exposed and heat-treated is etched.

The unexposed portion (=glass portion) etching rate in Formula (2) described below has the same meaning as the glass portion etching rate. A calculation method of the exposed portion etching rate will be described later.

[Math. 4]

$$\text{exposed portion/unexposed portion etching rate selectivity} = \frac{\text{exposed portion etching rate}}{\text{unexposed portion ( = glass portion) etching rate}} \quad (2)$$

The exposed portion etching rate in the above Formula (2) is calculated by the above Formula (1) by performing etching on the glass sample having the length of 30 mm×the width of 20 mm and the thickness of 0.5 mmt after performing exposure treatment and heat treatment. Specific treatment conditions are shown below.

(i) Exposure Treatment

By using an exposure apparatus (for example, manufactured by Japanese Science Engineering Co., Ltd, product name "MA-1200"), the entire flat-sheet-shaped glass is exposed so as to have an exposure amount of 15 $J/cm^2$.

(ii) Heat Treatment

A two-stage heat treatment is performed. Conditions for a first stage of heat treatment are heat treatment at 485° C. for 5 hours. Conditions for a second stage of heat treatment can be determined by the following method. First, a crystallization peak is confirmed using a differential thermal analysis (DTA) apparatus (for example, Thermoplus TG8120 manufactured by Rigaku Corporation). The heat treatment is performed at a temperature in a range of −50° C. to 150° C. from a temperature at which the crystallization peak is confirmed, and for a heat treatment time in a range of 1 hour to 3 hours. At this time, the glass of the same composition that is not subjected to exposure is also heat-treated under the same conditions, and the conditions under which it can be confirmed that no crystals are precipitated are defined as heat treatment conditions.

As a method for confirming the crystal precipitation, for example, there is a method based on microscopic observation. When observed with a microscopic using epi-illumination, since light scattering occurs in a portion where crystals are precipitated, the glass portion appears dark, whereas a crystal portion appears bright. Presence or absence of the crystal precipitation can be confirmed by the brightness and darkness.

(iii) Etching

The glass sample is immersed in 55 ml of the etching solution at 40° C. containing 5 mass % of HF and 0.7 mass % of $HNO_3$ for 4 minutes.

After the above treatments, the value obtained by the above Formula (1) is used as the exposed portion etching rate.

In the case where the exposed portion/unexposed portion etching rate selectivity calculated from the exposed portion etching rate and the unexposed portion (=glass portion) etching rate, which are obtained by the above method, is 3 or more, only the exposed portion can be easily selectively cut by etching, and the microfabrication property is improved.

A lower limit of the exposed portion/unexposed portion etching rate selectivity is, in the following preferred order, 4 or more, 5 or more, 6 or more, 7 or more, 8 or more, 9 or more, 10 or more, 11 or more, 12 or more, 13 or more, 14 or more, 15 or more, 16 or more, 17 or more, 18 or more, 19 or more, and 20 or more. An upper limit of the exposed portion/unexposed portion etching rate selectivity is not particularly limited and is generally 50 or less, 45 or less, particularly 40 or less.

In the photosensitive glass of the present embodiment, the transmittance (1 mmt converted value) at 430 nm when exposed at the exposure amount of 0.5 $J/cm^2$ and heat-treated at 485° C. for 5 hours is preferably 4% or more. High transmittance means that an amount of silver colloid generated in the glass is low and the exposure sensitivity is not too high. Therefore, in the case where the transmittance is 4% or more, it becomes easier to control a microstructure.

A lower limit of the transmittance is, in the following preferred order, 6% or more, 8% or more, 10% or more, 11% or more, 12% or more, 13% or more, 14% or more, and 15% or more. An upper limit of the transmittance is not particularly limited, and is in general 98% or less, 97% or less, 96% or less, 95% or less, 94% or less, 93% or less, 92% or less, 91% or less, and 90% or less.

The above exposure is performed using, for example, a light source unit for an exposure apparatus, Multi-light ML-251 DB (manufactured by USHIO INC.). Specifically, an intensity of the ultraviolet ray is measured using a combination of an accumulated UV meter UIT-250 and a light receiver UVH-S313, a time at which a desired exposure amount is obtained is calculated, and the ultraviolet ray is emitted by the exposure apparatus for the time.

Further, the above transmittance (1 mmt converted value) at 430 nm is determined by the following Formula (3) using, for example, a spectrophotometer V-570 (manufactured by JASCO Corporation, measurement wavelength range: 200 nm to 800 nm).

[Math. 5]

$$T' = (1-\rho)^2 \times \left\{ \frac{T}{(1-\rho)^2} \right\}^L \tag{3}$$

T': transmittance (1 mmt converted value), T: measured value of transmittance, ρ: reflectance, L: thickness of glass (mmt)

In the photosensitive glass of the present embodiment, regarding the transmittance (1 mmt converted value) at 430 nm measured when exposed at the exposure amount of 1 $J/cm^2$ to 10 $J/cm^2$ and heat-treated at 485° C. for 5 hours, when plotted on a coordinate plane in which the exposure amount is set as a horizontal axis $(J/cm^2)$ and the transmittance is set as a vertical axis (%), a slope of the transmittance (1 mmt converted value) at 430 nm, which is obtained by Formula (4) described below, is preferably −0.12 or less with respect to the exposure amount of 1 $J/cm^2$ to 10 $J/cm^2$.

[Math. 6]

$$slope = \frac{\sum(X - \text{sample average of } X)(Y - \text{sample average of } Y)}{\sum(X - \text{sample average of } X)^2} \tag{4}$$

X: exposure amount $(J/cm^2)$, Y: transmittance (1 mmt converted value) at 430 nm In Formula (4) described above, the exposure amount is in the range of 1 $J/cm^2$ to 10 $J/cm^2$, and the transmittance means the transmittance (1 mmt converted value) at 430 nm.

A measurement method for the exposure amount and the transmittance is obtained by the method described above.

The slope means a change amount of the transmittance with respect to a change amount of the exposure amount and that when the slope is large, the generation of the silver colloid corresponds to an increase in the exposure amount of 1 $J/cm^2$ to 10 $J/cm^2$. Therefore, it is possible to control the microstructure by adjusting the exposure amount when setting the slope to −0.12 or less.

The slope is more preferably −0.14 or less, further preferably −0.16 or less, yet more preferably −0.18 or less, and particularly preferably −0.20 or less. In the case where the slope is too small, the silver colloid is rapidly generated with respect to the increase in the exposure amount of 1 $J/cm^2$ to 10 $J/cm^2$, making it difficult to control the microstructure. Therefore, the slope is preferably −10 or more, more preferably −9 or more, and further preferably −8 or more.

Shape

A shape of the photosensitive glass of the present embodiment is not particularly limited, and various shapes can be made according to the purpose and application. For example, the photosensitive glass of the present embodiment may have a sheet shape having two main surfaces facing each other, or may have a shape other than the sheet shape according to a product to be applied, the application, or the like. More specifically, the photosensitive glass of the present embodiment may be, for example, a flat-sheet-shaped glass sheet having no warpage, or may be a curved glass sheet having a curved surface. A shape of the main surface is not particularly limited and can be formed into various shapes such as a circular shape and a quadrangular shape.

Manufacturing Method of Photosensitive Glass

Next, a manufacturing method of the photosensitive glass of the present embodiment (hereinafter, also referred to as the present manufacturing method) will be described. Hereinafter, a manufacturing method of sheet-shaped glass will be described, and the shape of the glass can be appropriately adjusted according to the purpose.

In this step, a raw material prepared so as to have a desired glass composition is melted and molded to thereby be an amorphous glass. The method of melting and molding is not particularly limited, and the glass raw material prepared by blending the glass raw material is put into a platinum crucible and put into an electric furnace at 1,350° C. to melt the raw material. Hereinafter, a temperature of the electric furnace is raised to 1,450 to defoam and homogenize the raw material. The reason why the melting temperature is initially set at 1,350° C. is to decompose silver chloride used as a raw material for $Ag_2O$ and dissolve the silver chloride into the glass. In the case where the temperature is too low, the silver chloride will not be decomposed and will not be dissolved into the glass. On the other hand, in the case where the temperature is too high, a thermal decomposition rate of the silver chloride becomes too fast, which makes it difficult to dissolve in the glass.

Therefore, as described above, first, the raw material is melted at 1,350° C., and then the temperature is raised to 1,450° C. The obtained molten glass is poured into a metal mold (for example, a SUS surface plate) at a room temperature, held at a temperature of a glass transition point for approximately 1 hours to 2 hours, and then cooled to the room temperature to thereby obtain a glass block of the amorphous glass. Further, the obtained glass block is subjected to process such as cutting, grinding, polishing, and the like as necessary to mold the glass block into a desired shape.

In this way, the amorphous glass can be molded into a desired shape from the molten state. Therefore, as compared to a process of molding and firing powder or slurry as in the case of ceramics, or a process of cutting an ingot into a desired shape after manufacturing the ingot as in the case of synthetic quartz, the amorphous glass has advantages of being easily molded, being easily increased in area, and capable of being manufactured at low cost.

Manufacturing Method of Glass in which Microstructure is Formed

A manufacturing method of a glass on which a microstructure is formed, which is an embodiment of the present invention, includes a step of selective microfabrication by optical structuring of the photosensitive glass of the present embodiment. The microfabrication method includes steps of exposing, heat-treating, and etching. That is the method includes (1) a step of exposing the photosensitive glass, (2) a step of precipitating the $Li_2SiO_3$ crystal by heat-treating the exposed photosensitive glass, and (3) a step of removing the precipitated $Li_2SiO_3$ crystal by etching treatment. The method may also include other steps.

(1) Step of Exposing the Photosensitive Glass

Hereinafter, the step of exposing the photosensitive glass will be exemplarily described.

First, the photosensitive glass is processed into a desired size. A surface requiring high accuracy may be polished.

Next, an optical mask on which a microfabricated pattern is formed is prepared, placed over the glass, followed by irradiating with the ultraviolet ray. As the optical mask, one used in normal ultraviolet ray exposure lithography can be used. The exposure conditions include, for example, irradiation with an ultraviolet ray having a wavelength of 200 nm to 380 nm at an energy density in a range of 0.1 J/cm$^2$ to 25 J/cm$^2$. The energy density is calculated using a wavelength-sensitive ultraviolet ray illuminance meter. Measurements are made by making the ultraviolet ray pass through a bandpass optical filter that transmits a specific wavelength range (for example, a wavelength of 300 nm to 320 nm) to a light-receiving unit of the illuminance meter.

(2) Step of Precipitating the $Li_2SiO_3$ Crystal by Heat-Treating the Exposed Photosensitive Glass Next, the photosensitive glass exposed in the above (1) is heat-treated to precipitate the $Li_2SiO_3$ crystal. This step preferably includes a two-stage heat treatment. The first stage of heat treatment is intended to colloidize metallic silver in the glass and produce the silver colloid, which will serve as the nucleus for crystallization. A second stage of heat treatment is intended to precipitate the $Li_2SiO_3$ crystal.

In one aspect of the present invention, a temperature range in the first stage of heat treatment, that is, a first temperature range is preferably a temperature range in which a crystal nucleation rate increases in the glass composition. Specifically, the first temperature range is preferably 400° C. or higher, more preferably 410° C. or higher, further preferably 420° C. or higher, and particularly preferably 430° C. or higher. In addition, the first temperature range is 500° C. or lower and more preferably 495° C. or lower.

In one aspect of the present invention, the temperature range in the first stage of heat treatment, that is, the first temperature range is preferably the temperature range in which the crystal nucleation rate increases in the glass composition. In the case where it is desired to promote crystal nucleation, the temperature range may be set higher. Specifically, the first temperature range is preferably 400° C. or higher, and is, in the following preferred order, 410° C. or higher, 420° C. or higher, and 430° C. or higher. In addition, the first temperature range is preferably 600° C. or lower, and is, in the following preferred order, 590° C. or lower, 580° C. or lower, 570° C. or lower, 560° C. or lower, and 550° C. or lower.

In one aspect of the present invention, a holding time in the first temperature range is, in the following preferred order, 15 minutes or more, 30 minutes or more, 45 minutes or more, 1 hour or more, 1 hour 15 minutes or more, 1 hour 30 minutes or more, 1 hour 45 minutes or more, 2 hours or more, 2 hours 15 minutes or more, 2 hours 30 minutes or more, 2 hours 45 minutes or more, 3 hours or more, 3 hours 15 minutes or more, 3 hours 30 minutes or more, 3 hours 45 minutes or more, and 4 hours or more. In the case where the holding time is within the above range, nucleation is likely to proceed sufficiently. On the other hand, the holding time in the first temperature range is preferably 15 hours or less, more preferably 14 hours or less, and particularly preferably 13 hours or less, from the viewpoint of productivity.

In one aspect of the present invention, the holding time in the first temperature range is, in the following preferred order, 1 minute or more, 5 minutes or more, 10 minutes or more, 15 minutes or more, 30 minutes or more, 45 minutes or more, 1 hour or more, 1 hour 15 minutes or more, 1 hour 30 minutes or more, 1 hour 45 minutes or more, 2 hours or more, 2 hours 15 minutes or more, 2 hours 30 minutes or more, 2 hours 45 minutes or more, 3 hours or more, 3 hours 15 minutes or more, 3 hours 30 minutes or more, 3 hours 45 minutes or more, and 4 hours or more. In the case where the holding time is within the above range, nucleation is likely to proceed sufficiently. On the other hand, the holding time in the first temperature range is preferably 15 hours or less, more preferably 14 hours or less, and particularly preferably 13 hours or less, from the viewpoint of productivity.

In one aspect of the present invention, a second temperature range is preferably a temperature range in which a crystal growth rate of the $Li_2SiO_3$ crystal increases. Specifically, the second temperature range is preferably 500° C. or higher, more preferably 505° C. or higher, and further preferably 510° C. or higher. In the case where the heat treatment temperature is increased, the crystal is easily grown, so that a heat treatment time can be shortened, but a transmittance of the unexposed portion tends to decrease. Therefore, the second temperature range is, in the preferred order, 700° C. or lower, 690° C. or lower, 680° C. or lower, 670° C. or lower, 660° C. or lower, and 650° C. or lower.

In one aspect of the present invention, the second temperature range is preferably the temperature range in which the crystal growth rate of the $Li_2SiO_3$ crystal increases. Specifically, the second temperature range is preferably (the first temperature range+5° C.) or higher, and is, in the following preferred order, (the first temperature range+10° C.) or higher, (the first temperature range+20° C.) or higher, (the first temperature range+30° C.) or higher, (the first temperature range+40° C.) or higher, and (the first temperature range+50° C.) or higher. In the case where the temperature range is increased, the crystal is easily grown, so that the heat treatment time can be shortened, but the transmittance of the unexposed portion tends to decrease. Therefore, the second temperature range is preferably (the first temperature range+300° C.) or lower, and is, in the following preferred order, (the first temperature range+290° C.) or lower, (the first temperature range+280° C.) or lower, (the first temperature range+270° C.) or lower, (the first temperature range+260° C.) or lower, (the first temperature range+250° C.) or lower, (the first temperature range+240° C.) or lower, (the first temperature range+230° C.) or lower, (the first temperature range+220° C.) or lower, (the first temperature range+210° C.) or lower, and (the first temperature range+200° C.) or lower.

In one aspect of the present invention, a holding time in the second temperature range is, in the following preferred order, 15 minutes or more, 30 minutes or more, 45 minutes or more, 1 hour or more, 1 hour 15 minutes or more, 1 hour 30 minutes or more, 1 hour 45 minutes or more, 2 hours or more, 2 hours 15 minutes or more, 2 hours 30 minutes or more, 2 hours 45 minutes or more, and 3 hours or more. In the case where the holding time is within the above range, the crystal growth is likely to proceed sufficiently. On the other hand, the holding time is preferably 15 hours or less, more preferably 14 hours or less, and particularly preferably 13 hours or less, from the viewpoint of productivity.

In one aspect of the present invention, the holding time in the second temperature range is, in the following preferred order, 1 minute or more, 5 minutes or more, 10 minutes or more, 15 minutes or more, 30 minutes or more, 45 minutes or more, 1 hour or more, 1 hour 15 minutes or more, 1 hour 30 minutes or more, 1 hour 45 minutes or more, 2 hours or more, 2 hours 15 minutes or more, 2 hours 30 minutes or more, 2 hours 45 minutes or more, and 3 hours or more. In the case where the holding time is within the above range, the crystal growth is likely to proceed sufficiently. On the other hand, the holding time is preferably 15 hours or less, more preferably 14 hours or less, and particularly preferably 13 hours or less, from the viewpoint of productivity.

A temperature-increasing rate in the heat treatment is not particularly limited and is generally 5° C./min or more, more preferably 15° C./min or more, and further preferably 30° C. min or more.

On the other hand, in the case where the temperature-increasing rate is preferably 300° C./min or less, more preferably 250° C./min or less, and further preferably 200° C./min or less, cracking due to a difference in expansion coefficient between a glass phase and the crystal phase during temperature increase can be prevented.

A temperature-decreasing rate is not particularly limited, and in the case where the temperature-decreasing rate is preferably 100° C./min or less, more preferably 90° C./min or less, and further preferably 80° C./min or less, warpage of the crystallized glass and cracking due to the difference in expansion coefficient between an amorphous phase and the crystal phase when the temperature is decreased can be prevented. On the other hand, the temperature-decreasing rate is generally 1° C./min or more, more preferably 5° C./min or more, and further preferably 10° C./min or more.

(3) Step of Removing the Precipitated $Li_2SiO_3$ Crystal by Etching Treatment Next, the precipitated $Li_2SiO_3$ crystal is removed by the etching treatment to structure a glass body. The etching treatment is preferably performed with an etching solution containing HF. In the case where the concentration of BF in the etching solution is too low, the etching of the $Li_2SiO_3$ crystal is difficult to proceed. Therefore, the concentration of HF in the solution is, in the following preferred order, 0.5 mass % or more, 1 mass % or more, 1.5 mass % or more, 2 mass % or more, 2.5 mass % or more, and 3 mass % or more.

On the other hand, in the case where the concentration of HF in the etching solution is too high, not only the crystal portion but also the glass portion is etched. Therefore, the concentration of HF is, in the following preferred order, 20 mass % or less, 18 mass % or less, 16 mass % or less, 14 mass % or less, 12 mass % or less, 10 mass % or less, 8 mass % or less, and 6 mass % or less.

In addition, the etching solution may contain HCl and $HNO_3$ in addition to the above-described HF. As a result, an acidity of the etching solution is increased and the residue generated by the etching is easily dissolved, and thus it is easier to achieve a more stable microstructure. A concentration of HCl or $HNO_3$ is generally preferably 0.1 mass % or more, more preferably 0.2 mass % or more, and particularly preferably 0.3 mass % or more. On the other hand, the concentration of HCl or $HNO_3$ is preferably 5 mass % or less, more preferably 4 mass % or less, and particularly preferably 3 mass % or less.

Circuit Substrate

The circuit substrate of the present embodiment includes an insulating substrate (hereinafter, also referred to as glass substrate) including the photosensitive glass or the glass in which the microstructure is formed on the photosensitive glass.

FIG. 1 illustrates an example of a structure of the circuit substrate of the present embodiment. A circuit substrate 1 shown in FIG. 1 includes a glass substrate 2 having insulating properties, a first wiring layer 3 formed on a first main surface 2a of the glass substrate 2, and a second wiring layer 4 formed on a second main surface 2b of the glass substrate 2. The first wiring layer 3 and the second wiring layer 4 form a microstrip line as an example of a transmission line. The first wiring layer 3 constitutes a signal wiring, and the second wiring layer 4 constitutes a ground line.

However, the structures of the first wiring layer 3 and the second wiring layer 4 are not limited to the above. A wiring layer may be formed only on one main surface of the glass substrate 2 or may be formed inside the glass substrate 2 instead of on the main surface of the glass substrate 2. In addition, the circuit substrate of the present embodiment may include other components (passive devices, active devices, circuit components, etc.) that are not shown in FIG. 1.

Accordingly, the circuit substrate of the present embodiment may be the circuit substrate including the glass substrate and the wiring layer formed inside or on at least one main surface of the glass substrate.

Application

The circuit substrate is preferably used for a high-frequency device in view of good dielectric properties in a high-frequency region and an excellent microfabrication property.

As described above, the circuit substrate may be a high-frequency device including a transmission line. Examples of the transmission line include, in addition to the microstrip line described above, a strip line, a coplanar line, a slot line, a waveguide, a substrate integrated waveguide (SIW), and a waveguide pipe.

Figure 2:
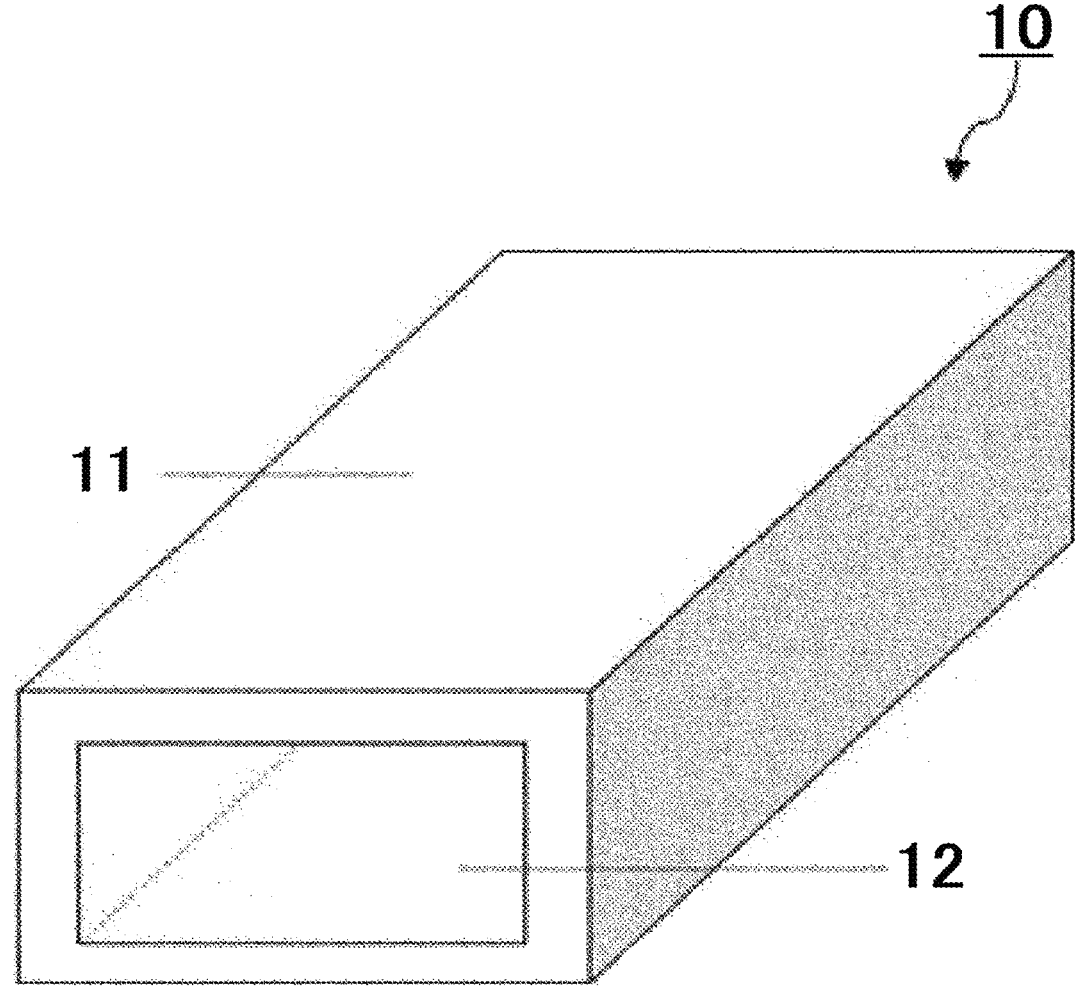
FIG. 2 is a schematic diagram illustrating an example of a waveguide pipe.

The waveguide pipe has a hollow structure. FIG. 2 illustrates a schematic representation of an example of the waveguide pipe. A waveguide pipe 10 shown in FIG. 2 has a glass substrate 11 and a hollow portion 12 inside the glass substrate 11. The waveguide pipe 10 has a structure in which a wall inside the tube is covered with metal and is used for transmitting electromagnetic waves. In this case, since the inside is hollow, that is, a dielectric that causes dielectric loss is air, a loss is low, and a large amount of power can be transmitted.

In addition, by applying an appropriate design to the circuit substrate of the present embodiment, a passive device function such as a filter, an antenna, a duplexer, or a diplexer can also be provided with a transmission line (wiring) function. For example, as a form of a filter which is one of high-frequency devices, a configuration using a transmission line such as a waveguide pipe, an SIW, or a microstrip line is known. In addition, a configuration in which a microstrip line is applied to an antenna application is also known.

As in other applications, the circuit substrate of the present embodiment may be used for a microfluidic device because the circuit substrate can be microfabricated. The microfluidic device is a generic term for a device for producing a microchannel or a reaction vessel for application in bio research and chemical engineering. A specific example is a biomimetic chip. The biomimetic chip is a technique that allows reproduction of a biological system, which is difficult to achieve in an experimental system in the related art, by forming minute flow channels on a chip that imitates human organs. The circuit substrate of the present embodiment may be applied to the biological field as described above and other fields.

EXAMPLES

Examples will be described below, and the present invention is not limited to these examples.

Test Example 1: Dielectric Properties and Processability of Photosensitive Glass In the following, glasses 1 to 9 and glasses 24 to 26 are working examples, and glasses 10 to 23 are comparative examples. Tables 1 to 4 show glass compositions of the glasses 1 to 26 in terms of mole percentage based on oxides. Tables 5 to 8 show the glass compositions of the glasses 1 to 26 in terms of mass percentage based on oxides.

Production of Photosensitive Glass

Glass raw materials were prepared so as to have a composition shown in Tables 1 to 4 in terms of mole percentage based on oxides, and weighed out to give about 400 g of glass. Then, the mixed raw materials were put in a platinum crucible, put into an electric furnace at 1,350° C., and stirred for about 1 hour. Thereafter, the temperature was raised to 1450° C., the mixed raw materials were stirred again for about 4 hours and then left to stand for about 2 hours to defoam and homogenize. The obtained molten glass was poured into a metal mold, held at 470° C. for 2 hours, and then lowered to 70° C. over 8 hours to thereby obtain a glass block.

Physical properties of the obtained glasses are shown in Tables 1 to 4. A blank column "—" in Tables 1 to 4 indicates that the corresponding physical property has not been measured.

Exposure, Heat Treatment, and Etching of Photosensitive Glass

The glasses 1 and 6 were subjected to exposure, heat treatment, and etching, and processability was examined.

Exposure

First, the obtained glass was processed into a flat sheet (length 30 mm×width 20 mm, thickness 0.5 mmt), and a surface was mirror-finished to prepare a sample. Thereafter, the sample was exposed using an exposure apparatus (manufactured by Japanese Science Engineering Co., Ltd, product name "MA-1200"). In this study, a method in which the entire flat-sheet-shaped glass was exposed. An exposure amount is shown in Table 9 described below.

Heat Treatment

The exposed glasses 1 and 6 were crystallized by being heat-treated at a temperature change shown in FIG. 3. FIG. 3 is a diagram schematically showing the temperature change in the two-stage heat treatment. Specifically, FIG. 3 shows that, in the heat treatment, the amorphous glass is heated to a temperature $T_1$, held for a certain time, then heated to a temperature $T_2$, held for a certain time, and then cooled. Conditions such as a specific temperature in the heat treatment of FIG. 3 is shown in Table 9 described below.

Presence or absence of precipitation of $Li_2SiO_3$ crystal was confirmed by microscopic observation/XRD measurement/spectral transmission spectrum measurement on the heat-treated glasses 1 and 6.

In the microscopic observation, when observed using epi-illumination, since light scattering occurs in a portion where crystals are precipitated, the glass portion appears dark, whereas the crystal portion appears bright. Based on the brightness and darkness, it is possible to confirm the presence or absence of the crystal precipitation.

In the XRD measurement, whether the peak of the $Li_2SiO_3$ crystal is represented was confirmed.

In addition, in the case of crystal precipitation, a decrease in the overall transmittance is confirmed in a near ultraviolet region to a near infrared region in the spectral transmission spectrum. According to the methods described above, the precipitation of the $Li_2SiO_3$ crystal in the glasses 1 and 6 was confirmed.

Etching

An etching test (immersion for 4 minutes in 55 ml of an etching solution at 40° C. containing 5 mass % of HF and 0.7 mass % of $HNO_3$) was performed on the glass on which the $Li_2SiO_3$ crystal was precipitated, obtained by the above method.

Methods of measuring physical properties are shown below.

XRD Measurement

Preparation Conditions of XRD Measurement Sample

The heat-treated crystallized glass sheet was cut into a length of 10 mm×a width of 10 mm, and a thickness of 0.5 mmt to thereby obtain a sample for XRD measurement.
XRD Measurement Conditions X-ray diffraction is measured under the following conditions, and a precipitated crystal is identified. For identification of crystal species, a diffraction peak pattern recorded in an ICSD inorganic crystal structure database and an ICDD powder diffraction database was used.

Measurement device: SmartLab manufactured by Rigaku Corporation
 Measurement method: concentration method tube voltage: 45 kV
 Tube current: 200 mA X-ray used: CuKα ray
 Measurement range: $2\theta=10°$ to $80°$
 Speed: 10°/min
 Step: 0.02°

Relative Permittivity: Dk and Dielectric Loss Tangent: Df

Using a network analyzer, the relative permittivity and the dielectric loss tangent at 10 GHz were measured by a split post dielectric resonator method (SPDR method). A measurement temperature was 20° C.

Glass Portion Etching Rate

The produced glass was processed into a flat sheet (length 30 mm×width 20 mm, thickness 0.5 mmt), and the surface was mirror-finished to prepare the sample. After washing and drying the produced sample and measuring a weight thereof, the etching test (immersion for 4 minutes in 55 ml of the etching solution at 40° C. containing 5 mass % of HF and 0.7 mass % of $HNO_3$) was performed. After the test, the sample was washed and dried again to measure the weight, and the glass portion (unexposed portion) etching rate was obtained by Calculation Formula (1) shown below.

[Math. 7]

$$\text{etching rate}\left(\frac{\mu m}{min}\right) = \frac{\text{weight loss } (g) \times \text{thickness of glass before testing } (\mu m)}{\text{weight of glass before testing } (g) \times \text{test time } (min)} \quad (1)$$

Exposed Portion/Unexposed Portion Etching Rate Selectivity

Regarding the glasses 1 and 6, the exposed portion/unexposed portion etching rate selectivity was calculated based on Formula (2) described below by obtaining the etching rate (exposed portion etching rate) when the exposure and the heat-treatment were performed and the etching rate (unexposed portion etching rate) when the exposure and the heat-treatment were not performed. Here, the unexposed portion etching rate has the same meaning as the glass portion etching rate. A calculation method of the exposed portion etching rate of this time will be described later.

[Math. 8]

$$\text{exposed portion/unexposed portion etching rate selectivity} = \frac{\text{exposed portion etching rate}}{\text{unexposed portion ( = glass portion) etching rate}} \quad (2)$$

The exposed portion etching rate in the above Formula (2) was calculated by the above Formula (1) by performing etching on the glass sample having the length of 30 mm the width of 20 mm and the thickness of 0.5 mmt after performing the exposure treatment and the heat treatment. Specific treatment conditions are shown below.
(i) Exposure Treatment By using an exposure apparatus (manufactured by Japanese Science Engineering Co., Ltd, product name "MA-1200"), the entire flat-sheet-shaped glass was exposed so as to have the exposure amount of 15 $J/cm^2$.
(ii) Heat Treatment A two-stage heat treatment was performed. The conditions for the first stage of heat treatment were heat treatment at 485° C. for 5 hours. The conditions for the second stage of heat treatment were determined by the following method. First, the crystallization peak was confirmed using the DTA apparatus (Thermoplus TG8120 manufactured by Rigaku Corporation). At this time, the heat treatment was performed at a temperature in a range of −150° C. to −100° C. from the temperature at which the crystallization peak was confirmed, for a heat treatment time of 1 hour or 3 hours. At this time, glass of the same composition that was not subjected to exposure was subjected to the same treatments, and it was confirmed that no crystals were precipitated. As a method for confirming the crystal precipitation, a method based on microscopic observation was used. When observed with a microscopic using epi-illumination, since light scattering occurs in a portion where crystals are precipitated, the glass portion appears dark, whereas a crystal portion appears bright. The presence or absence of the crystal precipitation was confirmed by the brightness and darkness.
(iii) Etching The glass sample was immersed in 55 ml of the etching solution at 40° C. containing 5 mass % of HF and 0.7 mass % of $HNO_3$ for 4 minutes.

After the above treatments, the value obtained by the above Formula (1) was used as the exposed portion etching rate.

Density

A density of about 20 g of bubble-free glass lump was measured by the Archimedes method.

Tg

Measurement was performed by a thermal expansion method in accordance with a method defined in JIS R3103-3 (2001).

Average Coefficient of Thermal Expansion

Measurement was performed using a differential thermal expansion meter in accordance with a method defined in JIS R3102 (1995). A measurement temperature range was 50° C. to 350° C., and the unit was $\times 10^{-7}/°$ C.

TABLE 1

| mol % | Glass 1 | Glass 2 | Glass 3 | Glass 4 | Glass 5 | Glass 6 | Glass 7 |
|---|---|---|---|---|---|---|---|
| $SiO_2$ | 68.6 | 68.6 | 70.1 | 68.6 | 70.1 | 68.6 | 68.6 |
| $Al_2O_3$ | 1.8 | 1.8 | 1.8 | 1.8 | 1.8 | 1.8 | 1.8 |
| $B_2O_3$ | 0.6 | 0.6 | 0.6 | 0.6 | 0.6 | 0.6 | 0.6 |
| $Li_2O$ | 16.5 | 16.5 | 15.9 | 17.5 | 16.8 | 18.3 | 18.3 |
| $Na_2O$ | 5.5 | 8.5 | 5.3 | 5.0 | 4.8 | 4.6 | 6.6 |
| $K_2O$ | 5.5 | 2.5 | 5.3 | 5.0 | 4.8 | 4.6 | 2.6 |
| ZnO | 1.4 | 1.4 | 0.9 | 1.4 | 0.9 | 1.4 | 1.4 |
| $Sb_2O_3$ | 0.058 | 0.058 | 0.058 | 0.058 | 0.058 | 0.058 | 0.058 |
| $CeO_2$ | 0.007 | 0.007 | 0.007 | 0.007 | 0.007 | 0.007 | 0.007 |
| $Ag_2O$ | 0.037 | 0.037 | 0.037 | 0.037 | 0.037 | 0.037 | 0.037 |
| Sum | 100 | 100 | 100 | 100 | 100 | 100 | 100 |
| Formula (A) | 0.60 | 0.60 | 0.60 | 0.64 | 0.64 | 0.67 | 0.67 |
| Dk @ 10 GHz | 6.88 | 6.86 | 6.78 | 6.87 | 6.78 | 6.86 | 6.85 |
| Df @ 10 GHz | 0.0071 | 0.0073 | 0.0075 | 0.0076 | 0.0081 | 0.0081 | 0.0079 |
| Glass portion etching rate (μm/min) | 2.35 | 1.91 | 1.84 | 2.20 | 1.73 | 2.01 | 1.82 |
| Density $\rho$ (g/cm³) | 2.44 | 2.44 | 2.42 | 2.43 | 2.41 | 2.43 | 2.43 |
| Tg (° C.) | 430 | — | — | 432 | — | 432 | 428 |
| Average coefficient of thermal expansion ($\times 10^{-7}°$ C.) | 123 | — | — | 118 | — | 117 | 118 |

TABLE 2

| mol % | Glass 8 | Glass 9 | Glass 10 | Glass 11 | Glass 12 | Glass 13 | Glass 14 |
|---|---|---|---|---|---|---|---|
| $SiO_2$ | 70.1 | 70.1 | 70.1 | 64.1 | 67.1 | 67.1 | 69.1 |
| $Al_2O_3$ | 1.8 | 1.8 | 3.3 | 3.3 | 3.3 | 3.3 | 1.3 |
| $B_2O_3$ | 0.6 | 0.6 | 0.6 | 0.6 | 0.6 | 0.6 | 0.6 |
| $Li_2O$ | 17.6 | 17.6 | 18.7 | 24.7 | 23.3 | 25.5 | 21.7 |
| $Na_2O$ | 4.4 | 6.4 | 1.7 | 1.7 | 0.0 | 1.0 | 1.7 |
| $K_2O$ | 4.4 | 2.4 | 4.1 | 4.1 | 4.1 | 1.0 | 4.1 |
| ZnO | 0.9 | 0.9 | 1.4 | 1.4 | 1.4 | 1.4 | 1.4 |
| $Sb_2O_3$ | 0.058 | 0.058 | 0.058 | 0.058 | 0.058 | 0.058 | 0.058 |
| $CeO_2$ | 0.007 | 0.007 | 0.007 | 0.007 | 0.007 | 0.007 | 0.007 |
| $Ag_2O$ | 0.037 | 0.037 | 0.037 | 0.037 | 0.037 | 0.037 | 0.037 |
| Sum | 100 | 100 | 100 | 100 | 100 | 100 | 100 |
| Formula (A) | 0.67 | 0.67 | 0.76 | 0.81 | 0.85 | 0.93 | 0.79 |
| Dk @ 10 GHz | 6.77 | 6.73 | 6.71 | 7.22 | 7.08 | 6.93 | 6.87 |
| Df @ 10 GHz | 0.0083 | 0.0084 | 0.0110 | 0.0112 | 0.0149 | 0.0135 | 0.0107 |
| Glass portion etching rate (μm/min) | 1.65 | 1.43 | 1.64 | 4.75 | 2.41 | 1.94 | 1.67 |
| Density $\rho$ (g/cm³) | 2.41 | 2.42 | 2.40 | 2.42 | 2.40 | 2.40 | 2.40 |

TABLE 2-continued

| mol % | Glass 8 | Glass 9 | Glass 10 | Glass 11 | Glass 12 | Glass 13 | Glass 14 |
|---|---|---|---|---|---|---|---|
| Tg (° C.) | — | — | 458 | 442 | 459 | 454 | — |
| Average coefficient of thermal expansion ($\times 10^{-7\circ}$ C.) | — | — | 100 | 115 | 101 | 99 | — |

TABLE 3

| mol % | Glass 15 | Glass 16 | Glass 17 | Glass 18 | Glass 19 | Glass 20 | Glass 21 |
|---|---|---|---|---|---|---|---|
| $SiO_2$ | 67.1 | 67.1 | 67.1 | 67.1 | 69.4 | 72.9 | 69.0 |
| $Al_2O_3$ | 1.3 | 3.3 | 3.3 | 3.3 | 2.5 | 3.3 | 2.0 |
| $B_2O_3$ | 0.6 | 3.6 | 0.6 | 0.6 | 5.0 | 0.6 | 0.0 |
| $Li_2O$ | 21.7 | 18.7 | 21.7 | 21.7 | 17.4 | 21.7 | 21.0 |
| $Na_2O$ | 1.7 | 1.7 | 2.9 | 4.1 | 1.3 | 0.0 | 5.0 |
| $K_2O$ | 4.1 | 4.1 | 2.9 | 1.7 | 3.3 | 0.0 | 1.0 |
| ZnO | 3.4 | 1.4 | 1.4 | 1.4 | 1.0 | 1.4 | 1.9 |
| $Sb_2O_3$ | 0.058 | 0.058 | 0.058 | 0.058 | 0.058 | 0.058 | 0.058 |
| $CeO_2$ | 0.007 | 0.007 | 0.007 | 0.007 | 0.007 | 0.007 | 0.007 |
| $Ag_2O$ | 0.037 | 0.037 | 0.037 | 0.037 | 0.037 | 0.037 | 0.037 |
| Sum | 100 | 100 | 100 | 100 | 100 | 100 | 100 |
| Formula (A) | 0.79 | 0.76 | 0.79 | 0.79 | 0.79 | 1.00 | 0.78 |
| Dk @ 10 GHz | 6.93 | 6.72 | 6.92 | 6.90 | 6.53 | 6.27 | 6.76 |
| Df @ 10 GHz | 0.0097 | 0.0107 | 0.0102 | 0.0099 | 0.0118 | 0.0155 | 0.0093 |
| Glass portion etching rate (µm/min) | 2.23 | 2.46 | 2.24 | 2.15 | 1.58 | 0.97 | 1.52 |
| Density $\rho$ (g/cm³) | 2.44 | 2.42 | 2.42 | 2.42 | 2.40 | 2.37 | 2.42 |
| Tg (° C.) | — | — | — | — | — | — | — |
| Average coefficient of thermal expansion ($\times 10^{-7\circ}$ C.) | — | — | — | — | — | — | — |

TABLE 4

| mol % | Glass 22 | Glass 23 | Glass 24 | Glass 25 | Glass 26 |
|---|---|---|---|---|---|
| $SiO_2$ | 71.9 | 67.1 | 67.1 | 67.1 | 67.1 |
| $Al_2O_3$ | 1.0 | 3.3 | 3.3 | 3.3 | 3.3 |
| $B_2O_3$ | 0.0 | 0.6 | 0.6 | 0.6 | 0.6 |
| $Li_2O$ | 18.0 | 9.2 | 13.7 | 16.5 | 18.3 |
| $Na_2O$ | 2.0 | 9.2 | 6.9 | 5.5 | 4.6 |
| $K_2O$ | 2.0 | 9.2 | 6.9 | 5.5 | 4.6 |
| ZnO | 5.0 | 1.4 | 1.4 | 1.4 | 1.4 |
| $Sb_2O_3$ | 0.058 | 0.058 | 0.058 | 0.058 | 0.058 |
| $CeO_2$ | 0.007 | 0.007 | 0.007 | 0.007 | 0.007 |
| $Ag_2O$ | 0.037 | 0.037 | 0.037 | 0.037 | 0.037 |
| Sum | 100 | 100 | 100 | 100 | 100 |
| Formula (A) | 0.82 | 0.33 | 0.50 | 0.60 | 0.67 |
| Dk @ 10 GHz | 6.41 | 7.00 | 6.95 | 6.94 | 6.93 |
| Df @ 10 GHz | 0.0094 | 0.0057 | 0.0065 | 0.0075 | 0.0082 |

0.0094

TABLE 4-continued

| mol % | Glass 22 | Glass 23 | Glass 24 | Glass 25 | Glass 26 |
|---|---|---|---|---|---|
| Glass portion etching rate (µm/min) | 1.49 | 5.94 | 4.19 | 3.43 | 2.85 |
| Density $\rho$ (g/cm³) | 2.45 | 2.48 | 2.46 | 2.44 | 2.43 |
| Tg (° C.) | — | 427 | 428 | 432 | 435 |
| Average coefficient of thermal expansion ($\times 10^{-7\circ}$ C.) | — | 136 | 125 | 120 | 114 |

27

28

TABLE 5

| mass % | Glass 1 | Glass 2 | Glass 3 | Glass 4 | Glass 5 | Glass 6 | Glass 7 |
|---|---|---|---|---|---|---|---|
| $SiO_2$ | 70.6 | 71.7 | 72.1 | 71.1 | 72.7 | 71.6 | 72.5 |
| $Al_2O_3$ | 3.2 | 3.3 | 3.2 | 3.2 | 3.2 | 3.2 | 3.3 |
| $B_2O_3$ | 0.7 | 0.7 | 0.7 | 0.7 | 0.7 | 0.7 | 0.7 |
| $Li_2O$ | 8.4 | 8.6 | 8.1 | 9.0 | 8.7 | 9.5 | 9.6 |
| $Na_2O$ | 5.8 | 9.2 | 5.6 | 5.3 | 5.1 | 4.9 | 7.2 |
| $K_2O$ | 8.9 | 4.1 | 8.5 | 8.1 | 7.8 | 7.5 | 4.3 |
| $ZnO$ | 1.9 | 2.0 | 1.2 | 2.0 | 1.3 | 2.0 | 2.0 |
| $Sb_2O_3$ | 0.291 | 0.296 | 0.291 | 0.294 | 0.293 | 0.296 | 0.299 |
| $CeO_2$ | 0.022 | 0.022 | 0.022 | 0.022 | 0.022 | 0.022 | 0.022 |
| $Ag_2O$ | 0.146 | 0.148 | 0.146 | 0.147 | 0.147 | 0.148 | 0.149 |
| Sum | 100 | 100 | 100 | 100 | 100 | 100 | 100 |

TABLE 6

| mass % | Glass 8 | Glass 9 | Glass 10 | Glass 11 | Glass 12 | Glass 13 | Glass 14 |
|---|---|---|---|---|---|---|---|
| $SiO_2$ | 73.2 | 74.0 | 72.8 | 68.7 | 71.5 | 73.7 | 74.0 |
| $Al_2O_3$ | 3.2 | 3.3 | 5.9 | 6.1 | 6.0 | 6.2 | 2.4 |
| $B_2O_3$ | 0.7 | 0.7 | 0.7 | 0.8 | 0.8 | 0.8 | 0.8 |
| $Li_2O$ | 9.2 | 9.3 | 9.6 | 13.2 | 12.4 | 13.9 | 11.5 |
| $Na_2O$ | 4.7 | 7.0 | 1.8 | 1.8 | 0.0 | 1.1 | 1.8 |
| $K_2O$ | 7.2 | 4.0 | 6.7 | 7.0 | 6.9 | 1.7 | 6.9 |
| $ZnO$ | 1.3 | 1.3 | 2.0 | 2.0 | 2.0 | 2.1 | 2.0 |
| $Sb_2O_3$ | 0.295 | 0.299 | 0.294 | 0.303 | 0.301 | 0.311 | 0.303 |
| $CeO_2$ | 0.022 | 0.022 | 0.022 | 0.023 | 0.023 | 0.023 | 0.023 |
| $Ag_2O$ | 0.148 | 0.149 | 0.147 | 0.152 | 0.151 | 0.155 | 0.152 |
| Sum | 100 | 100 | 100 | 100 | 100 | 100 | 100 |

TABLE 7

| mass % | Glass 15 | Glass 16 | Glass 17 | Glass 18 | Glass 19 | Glass 20 | Glass 21 |
|---|---|---|---|---|---|---|---|
| $SiO_2$ | 71.3 | 69.4 | 71.3 | 71.8 | 72.0 | 78.9 | 74.5 |
| $Al_2O_3$ | 2.4 | 5.8 | 6.0 | 6.1 | 4.4 | 6.1 | 3.7 |
| $B_2O_3$ | 0.8 | 4.3 | 0.8 | 0.8 | 6.0 | 0.8 | 0.0 |
| $Li_2O$ | 11.5 | 9.6 | 11.4 | 11.5 | 8.9 | 11.7 | 11.3 |
| $Na_2O$ | 1.8 | 1.8 | 3.2 | 4.6 | 1.4 | 0.0 | 5.6 |
| $K_2O$ | 6.9 | 6.7 | 4.8 | 2.8 | 5.4 | 0.0 | 1.7 |
| $ZnO$ | 4.9 | 2.0 | 2.0 | 2.0 | 1.4 | 2.0 | 2.8 |
| $Sb_2O_3$ | 0.301 | 0.293 | 0.301 | 0.303 | 0.294 | 0.306 | 0.306 |
| $CeO_2$ | 0.022 | 0.022 | 0.022 | 0.023 | 0.022 | 0.023 | 0.023 |
| $Ag_2O$ | 0.150 | 0.146 | 0.150 | 0.151 | 0.147 | 0.153 | 0.153 |
| Sum | 100 | 100 | 100 | 100 | 100 | 100 | 100 |

TABLE 8

| mass % | Glass 22 | Glass 23 | Glass 24 | Glass 25 | Glass 26 |
|---|---|---|---|---|---|
| $SiO_2$ | 75.7 | 64.4 | 66.8 | 68.3 | 69.3 |
| $Al_2O_3$ | 1.8 | 5.4 | 5.6 | 5.8 | 5.8 |
| $B_2O_3$ | 0.0 | 0.7 | 0.7 | 0.7 | 0.7 |
| $Li_2O$ | 9.4 | 4.4 | 6.8 | 8.3 | 9.4 |
| $Na_2O$ | 2.2 | 9.1 | 7.0 | 5.8 | 4.9 |
| $K_2O$ | 3.3 | 13.8 | 10.7 | 8.8 | 7.4 |
| $ZnO$ | 7.1 | 1.8 | 1.9 | 1.9 | 1.9 |
| $Sb_2O_3$ | 0.298 | 0.272 | 0.282 | 0.288 | 0.292 |
| $CeO_2$ | 0.022 | 0.020 | 0.021 | 0.022 | 0.022 |
| $Ag_2O$ | 0.149 | 0.136 | 0.141 | 0.144 | 0.146 |
| Sum | 100 | 100 | 100 | 100 | 100 |

TABLE 9

| | | Glass 1 | Glass 6 |
|---|---|---|---|
| Exposure | | | |
| Illuminance ($mw/cm^2$) | | 21.4 | 21.4 |
| Exposure amount ($J/cm^2$) | | 15 | 15 |
| Heat treatment | | | |
| ① Temperature increase (° C./h) | | 150 | |
| ② Nucleation process | Temperature (° C.) | 485 | |
| | Time (h) | 5 | |
| ③ Temperature increase (° C./h) | | 50 | |
| ④ Crystallization process | Temperature (° C.) | 590 | 575 |
| | Time (h) | 3 | 1 |

TABLE 9-continued

| | Glass 1 | Glass 6 |
|---|---|---|
| ⑤ Temperature decrease (° C./h) | 30 | |
| ⑥ Temperature decrease (° C./h) | 60 | |
| Etching result of crystal portion | | |
| Exposed portion etching rate (µm/min) | 24.17 | 27.02 |
| Unexposed portion (glass portion) etching rate (µm/min) | 2.35 | 2.01 |
| Exposed portion/unexposed portion etching rate selectivity | 10.28 | 13.45 |

In the glasses 1 to 9 and the glasses 25 to 27, since the value of Formula (A) is 0.50 or more and 0.75 or less, the dielectric loss tangent at 20° C. and 10 GHz is a good value of 0.0090 or less.

In addition, in the glasses 1 to 9 and the glasses 25 to 27, the $SiO_2$ content is 65% in terms of mass percentage, and the etching rate of the amorphous glass portion, which is the unexposed portion, is 2.75 or less.

Regarding the glasses 1 and 6, the precipitation of the $Li_2SiO_3$ crystal was actually confirmed by exposure and heat treatment.

On the other hand, the glasses 10 to 22 had the value of Formula (A) exceeding 0.75 and the dielectric loss tangent at 20° C. and 10 GHz exceeding 0.0090 and had poor dielectric properties as compared to the glasses 1 to 9 and the glasses 25 to 27 of Examples.

The glass 23 also had the value of Formula (A) exceeding 0.75, a relative permittivity at 20° C. and 10 GHz higher than the glasses 1 to 9 and the glasses 25 to 27 of Examples, and had poor dielectric properties.

In the glass 24, the value of Formula (A) was less than 0.50 and the $SiO_2$ amount was less than 65% in terms of mass percentage, and thus a value of the glass portion etching rate was as high as 5.94. Therefore, it is expected that the microfabrication property is poor and the $Li_2O$ content is very low compared to other examples, making it difficult for the $Li_2SiO_3$ crystal to be precipitated.

Next, Examples based on calculation results (Calculation Examples 1 to 7) are shown in Tables 10 and 11. Table 10 shows the composition of the glass expressed in mole percentage, and the relative permittivity and dielectric loss tangent at 10 GHz and the glass portion etching rate that were predicted from calculations based on the composition. Since trace components $Sb_2O_3$, $CeO_2$, and $Ag_2O$ are expected to have almost no effect on the above-mentioned physical properties, calculations were performed based on the composition excluding the trace components. In addition, Table 11 shows the components shown in Table 10 in terms of mass percentage. In Table 11, the total amount is 100% because the compositions excluding the trace components are converted into the total amount.

TABLE 10

| mol % | Calculation Example 1 | Calculation Example 2 | Calculation Example 3 | Calculation Example 4 | Calculation Example 5 | Calculation Example 6 | Calculation Example 7 |
|---|---|---|---|---|---|---|---|
| $SiO_2$ | 69.6 | 70.6 | 71.6 | 69.6 | 69.6 | 70.6 | 70.6 |
| $Al_2O_3$ | 1.8 | 1.8 | 1.8 | 1.8 | 1.8 | 1.8 | 1.8 |
| $B_2O_3$ | 0.6 | 0.6 | 0.6 | 0.6 | 0.6 | 0.6 | 0.6 |
| $Li_2O$ | 15.5 | 14.5 | 13.5 | 15.5 | 15.5 | 14.5 | 14.5 |
| $Na_2O$ | 5.5 | 5.5 | 5.5 | 6.5 | 7.5 | 6.5 | 7.5 |
| $K_2O$ | 5.5 | 5.5 | 5.5 | 4.5 | 3.5 | 4.5 | 3.5 |
| ZnO | 1.4 | 1.4 | 1.4 | 1.4 | 1.4 | 1.4 | 1.4 |
| $Sb_2O_3$ | — | — | — | — | — | — | — |
| $CeO_2$ | — | — | — | — | — | — | — |
| $Ag_2O$ | — | — | — | — | — | — | — |
| Sum | 100 | 100 | 100 | 100 | 100 | 100 | 100 |
| Formula (A) | 0.58 | 0.57 | 0.55 | 0.58 | 0.58 | 0.57 | 0.57 |
| Dk @ 10 GHz | 6.75 | 6.68 | 6.62 | 6.84 | 6.87 | 6.70 | 6.73 |
| Df @ 10 GHz | 0.0074 | 0.0075 | 0.0077 | 0.0068 | 0.0064 | 0.0071 | 0.0068 |
| Glass portion etching rate (µm/min) | 2.12 | 1.74 | 1.46 | 2.44 | 2.29 | 1.69 | 1.64 |

TABLE 11

| mass % | Calculation Example 1 | Calculation Example 2 | Calculation Example 3 | Calculation Example 4 | Calculation Example 5 | Calculation Example 6 | Calculation Example 7 |
|---|---|---|---|---|---|---|---|
| $SiO_2$ | 71.5 | 72.2 | 72.9 | 71.9 | 72.3 | 72.6 | 73.0 |
| $Al_2O_3$ | 3.2 | 3.2 | 3.2 | 3.2 | 3.2 | 3.2 | 3.2 |
| $B_2O_3$ | 0.7 | 0.7 | 0.7 | 0.7 | 0.7 | 0.7 | 0.7 |
| $Li_2O$ | 7.9 | 7.4 | 6.8 | 8.0 | 8.0 | 7.4 | 7.4 |
| $Na_2O$ | 5.8 | 5.8 | 5.8 | 6.9 | 8.0 | 6.9 | 8.0 |
| $K_2O$ | 8.9 | 8.8 | 8.8 | 7.3 | 5.7 | 7.2 | 5.7 |
| ZnO | 1.9 | 1.9 | 1.9 | 2.0 | 2.0 | 1.9 | 2.0 |
| $Sb_2O_3$ | — | — | — | — | — | — | — |

TABLE 11-continued

| mass % | Calculation Example 1 | Calculation Example 2 | Calculation Example 3 | Calculation Example 4 | Calculation Example 5 | Calculation Example 6 | Calculation Example 7 |
|---|---|---|---|---|---|---|---|
| $CeO_2$ | — | — | — | — | — | — | — |
| $Ag_2O$ | — | — | — | — | — | — | — |
| Sum | 100 | 100 | 100 | 100 | 100 | 100 | 100 |

In Calculation Examples 1 to 7, the $Al_2O_3$ content is less than 5% and the $Li_2O$ is 15% or less in terms of mass percentage, and thus the value of Formula (A) is 0.75 or less. Therefore, it is expected that a predicted value of the dielectric loss tangent at 10 GHz is a good value of 0.0090 or less. In addition, since the $SiO_2$ content is 65% or more in terms of mass percentage, it was expected that a predicted value of the etching rate of the amorphous glass portion, which is the unexposed portion, was also 2.75 or less.

Test Example 2: Effect Due to Difference in Silver Amount

Figure 4:
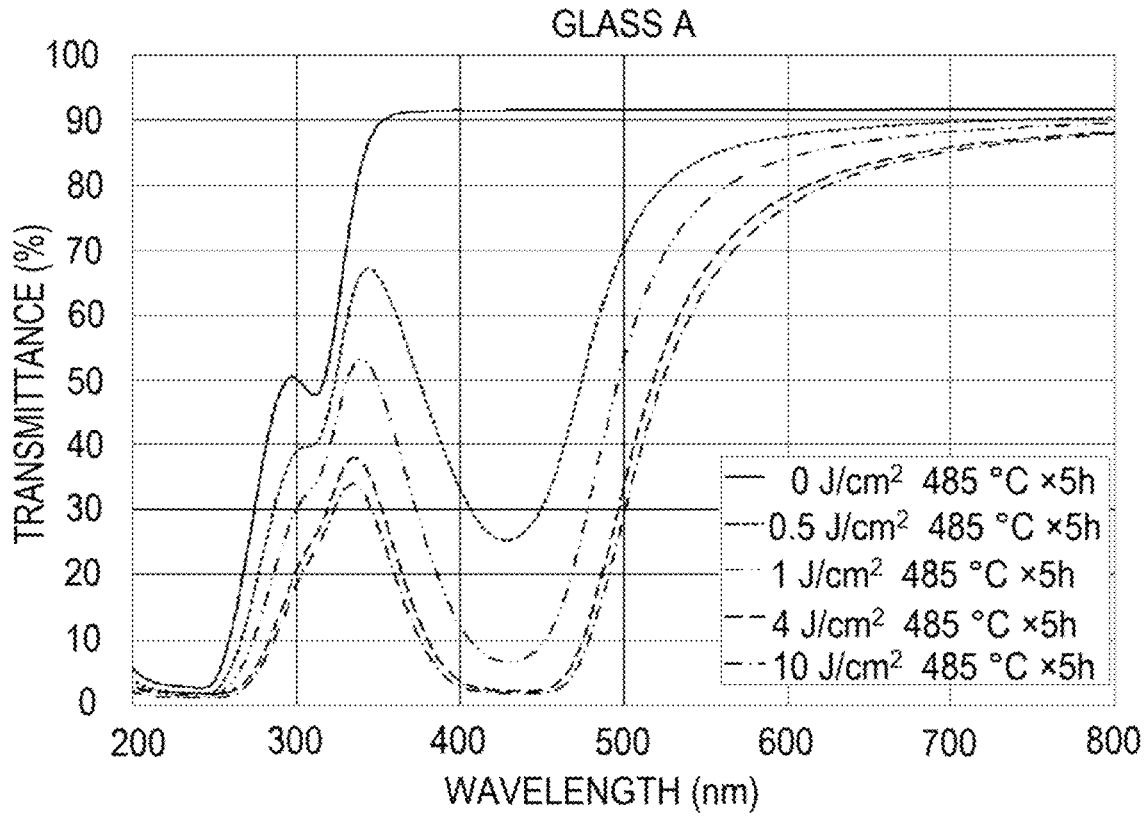
FIG. 4 is a graph showing measurement results of a transmittance of glass A of Example.
Figure 5:
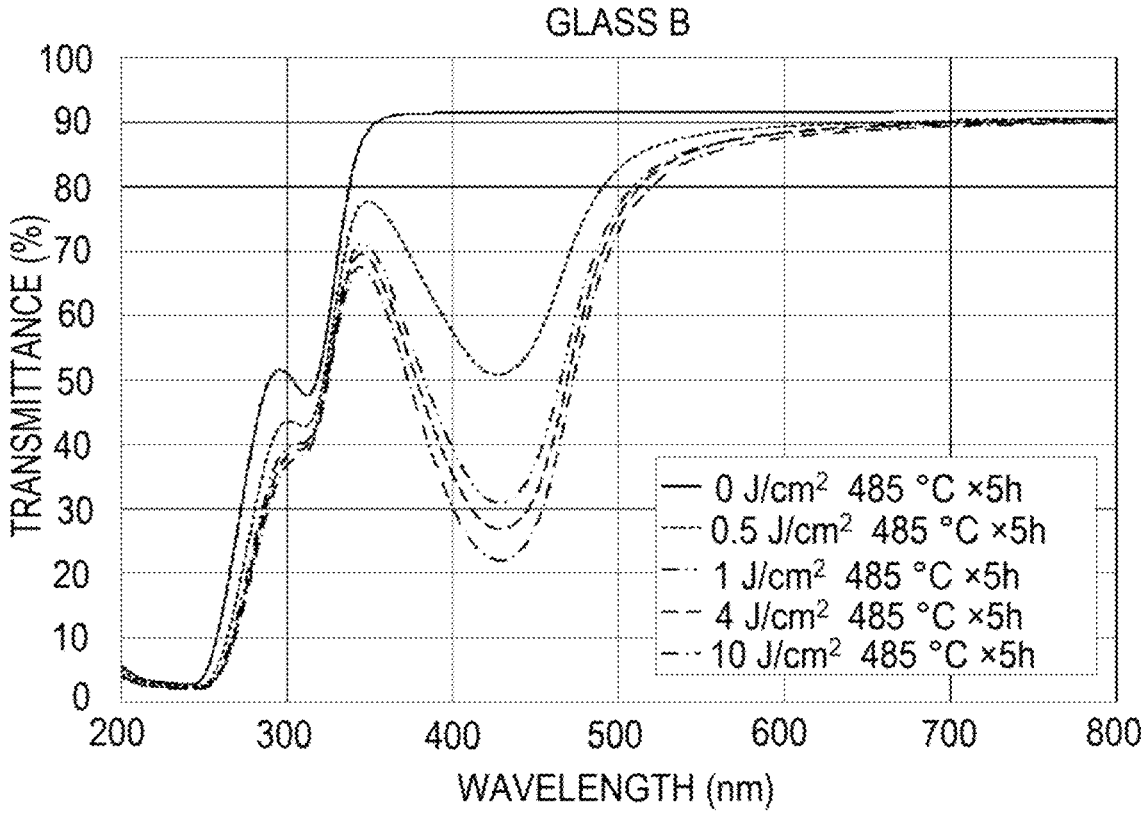
FIG. 5 is a graph showing measurement results of a transmittance of glass B of Example.
Figure 6:
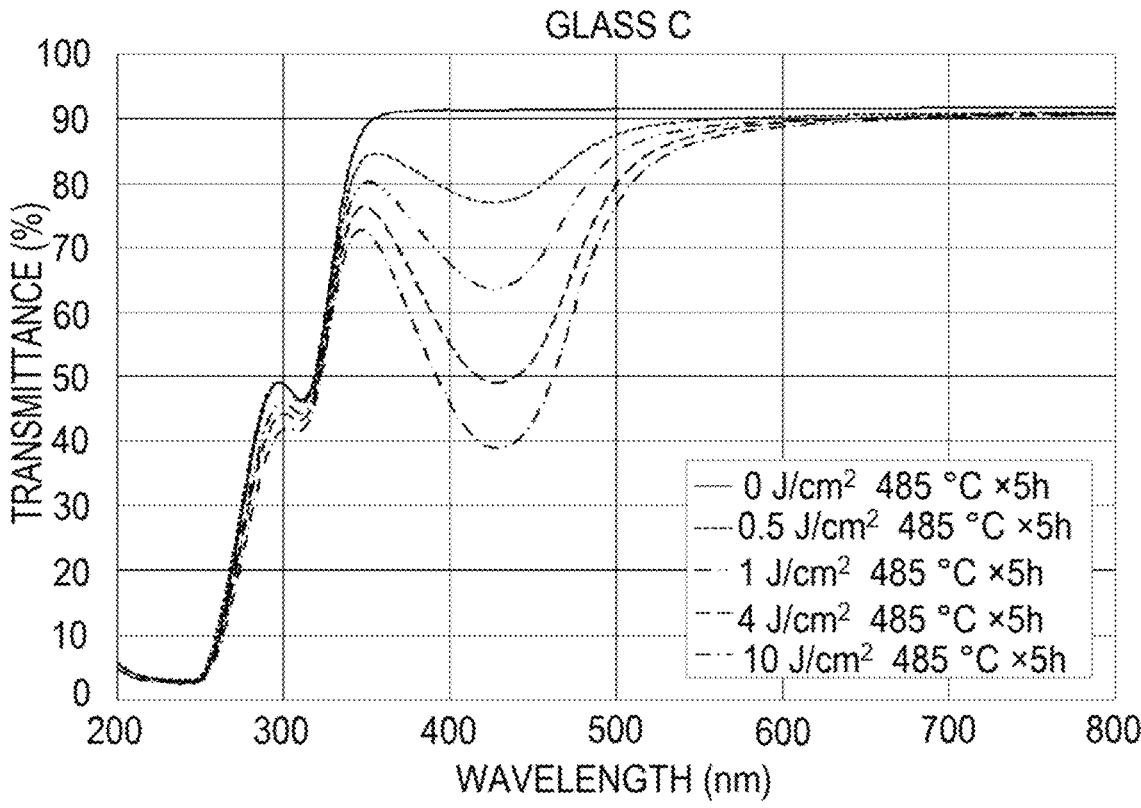
FIG. 6 is a graph showing measurement results of a transmittance of glass C of Example.

Next, a difference due to a content of silver in the photosensitive glass will be described. Glasses A, B, and C include different contents of silver. After the exposure and the heat treatment were performed on each glass, data on measured transmittances are shown in FIGS. 4 to 6. The silver content, the exposure amount, and the heat treatment conditions of these glasses are shown in Table 12.

TABLE 12

| | Glass A | Glass B | Glass C |
|---|---|---|---|
| $Ag_2O$ [wt %] | 0.15 | 0.18 | 0.24 |
| Exposure amount (J/cm²) | | 0, 0.5, 1.0, 4.0, 10 | |
| Heat treatment temperature | | 485 | |
| Heat treatment time (h) | | 5 | |

An exposure method and a transmittance measurement method in the present test example are shown below. A size of a sample that was subjected to the exposure and the transmittance measurement is a flat sheet having 10 mm×10 mm and a thickness of 2 mmt.

Exposure Method

The sample was exposed by the following method.

Apparatus Name

Light source unit for an exposure apparatus, Multi-light ML-251D/B (manufactured by USHIO INC.)

Apparatus Configuration

Lighting: MPL-25131
Lamp: Ultra-high pressure mercury lamp USH-250BY
Lamp power supply: HB-25103BY-C
Irradiation optical unit: PM25C-75

Exposure Method

The ultraviolet ray intensity was measured using a combination of the accumulated UV meter UIT-250 and the light receiver UVH-S313. Then, a time required to reach a desired exposure amount was calculated, and the ultraviolet ray was irradiated for that time using the exposure apparatus.

Transmittance Measurement

The transmittance was measured under the following conditions.

Measurement apparatus: spectrophotometer V-570 (manufactured by JASCO Corporation)

Measurement wavelength range: 200 nm to 800 nm

During spectroscopic measurements, a sample holder having an φ3 mm opening was used.

FIGS. 4 to 6 are graphs showing the transmittance (1 mmt converted value) of the glasses A, B, and C according to the exposure amount. Moreover, the transmittance shown here is a value converted into a transmittance corresponding to a thickness of 1 mmt using the following Formula (3).

[Math. 9]

$$T' = (1 - \rho)^2 \times \left\{ \frac{T}{(1 - \rho)^2} \right\}^L \tag{3}$$

T': transmittance (1 mmt converted value), T: measured value of transmittance, ρ: reflectance, L: thickness of glass (mmt)

In FIGS. 4 to 6, it can be seen that around 430 nm is a region where the silver colloid has an absorption peak, and as the exposure amount increases, the transmittance at 430 nm becomes lower. This indicates that as the exposure amount increased, the generation of the silver colloid was promoted, and as a result, the transmittance around 430 nm decreased.

Figure 7:
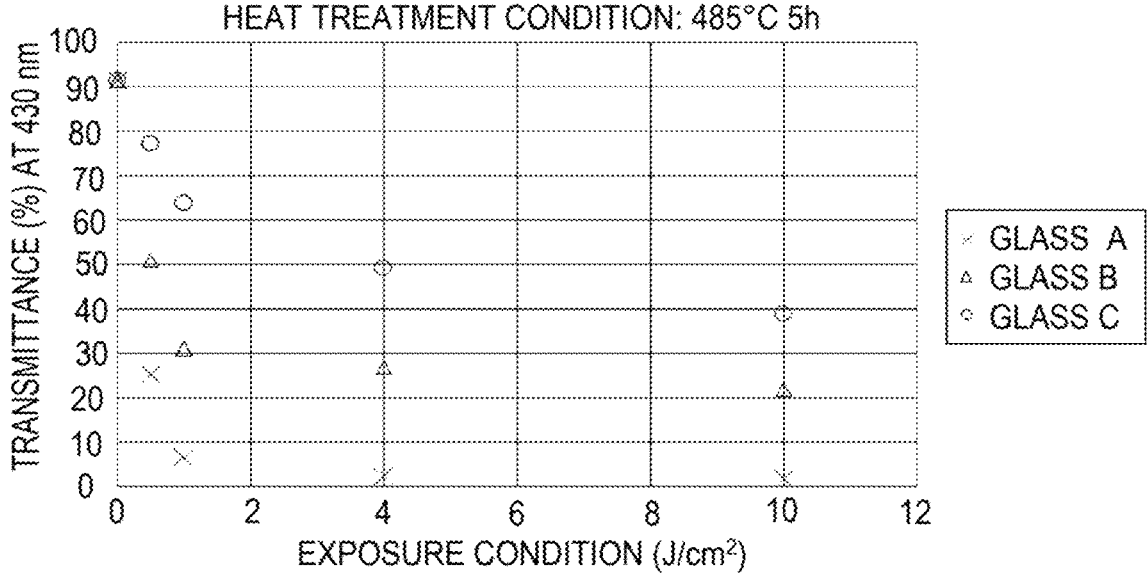
FIG. 7 is a graph plotting a relation between an exposure amount and a transmittance at 430 nm in the glasses A to C of Example.

The transmittance at 430 nm converted to 1 mmt is expressed as $T_{430\_1\ mmt}$, and based on these results, FIG. 7 is a new plot with a horizontal axis exposure amount (J/cm²) and a vertical axis $T_{430\_1}$ mmt. Based on FIG. 7, Table 13 shows $T_{430\_1\ mmt}$ at the exposure amount of 0.5 J/cm² for each glass and a slope of $T_{430\_1\ mmt}$ with respect to the exposure amount of 1 J/cm² to 10 J/cm². At this time, the slope of $T_{430\_1\ mmt}$ is obtained using Formula (4) described below.

[Math. 10]

$$\text{slope} = \frac{\sum (X - \text{sample average of } X)(Y - \text{sample average of } Y)}{\sum (X - \text{sample average of } X)^2} \tag{4}$$

X: exposure amount (J/cm²), Y: transmittance (1 mmt converted value) at 430 nm

TABLE 13

|  | Glass A | Glass B | Glass C |
|---|---|---|---|
| $T_{430\_1\ mmt}$ at 0.5 J/cm$^2$ (%) | 25.29 | 50.90 | 77.12 |
| Slope of $T_{430\_1\ mmt}$ at 1 J/cm$^2$ to 10 J/cm$^2$ (%) | −0.46 | −0.98 | −2.62 |

Focusing on the exposure amount of 0.5 J/cm$^2$, it can be seen that $T_{430\_1\ mmt}$ increases as the silver content in the glass increases. That is, the silver colloid tends to be less likely to be generated even with the same exposure amount. In the case where $T_{430\_1\ mmt}$ at 0.5 J/cm$^2$ is less than 4%, the exposure sensitivity is too high and it becomes difficult to control the microstructure.

Focusing on the slope of $T_{430\_1\ mmt}$ at the exposure amount of 1 J/cm$^2$ to 10 J/cm$^2$, it can be seen that an absolute value of the slope increases as the silver content in the glass increases. In other words, in the case where the amount of silver is small, the silver colloid generation is almost saturated at an exposure amount of 1 J/cm$^2$ or less. On the other hand, in the case where the amount of silver is large, the silver colloid generation exhibits a relatively linear response to an exposure amount of 1 J/cm$^2$ or more.

In the case where the slope of $T_{430\_1\ mmt}$ at 1 J/cm$^2$ to 10 J/cm$^2$ becomes larger than −0.12 (getting close to zero), the silver colloid generation is saturated at the exposure amount of 1 J/cm$^2$ or less, making it difficult to control the microstructure.

Next, Examples (Calculation Examples A to F) based on calculation results are shown in Table 14. Table 14 shows the silver content in the glass, which is shown in terms of mass percentage, $T_{430\_1\ mmt}$ at 0.5 J/cm$^2$ that is predicted from calculations based on the silver content, and the slope of $T_{430\_1\ mmt}$ at 1 J/cm$^2$ to 10 J/cm$^2$.

TABLE 14

|  | Calculation Example A | Calculation Example B | Calculation Example C | Calculation Example D | Calculation Example E | Calculation Example F |
|---|---|---|---|---|---|---|
| Ag$_2$O [wt %] | 0.12 | 0.10 | 0.08 | 0.06 | 0.05 | 0.04 |
| $T_{430\_1\ mmt}$ at 0.5 J/cm$^2$ (%) | 20.88 | 13.57 | 8.50 | 5.20 | 4.25 | 3.13 |
| Slope of $T_{430\_1\ mmt}$ at 1 J/cm$^2$ to 10 J/cm$^2$ (%) | −0.39 | −0.28 | −0.20 | −0.14 | −0.12 | −0.10 |

From Table 14, it is expected that in the case where the silver content is lower than 0.05%, $T_{430\_1\ mmt}$ at 0.5 J/cm$^2$ is less than 4%, and the exposure sensitivity is too high, making it difficult to control the microstructure.

In the case where the silver content is less than 0.05%, it is expected that the slope of $T_{430\_1\ mmt}$ at the exposure amount of 1 J/cm$^2$ to 10 J/cm$^2$ becomes larger than −0.12 (getting close to zero), the silver colloid generation is saturated at the exposure amount of 1 J/cm$^2$ or less, making it difficult to control the microstructure.

Calculation Example of Transmission Loss

Figure 8:
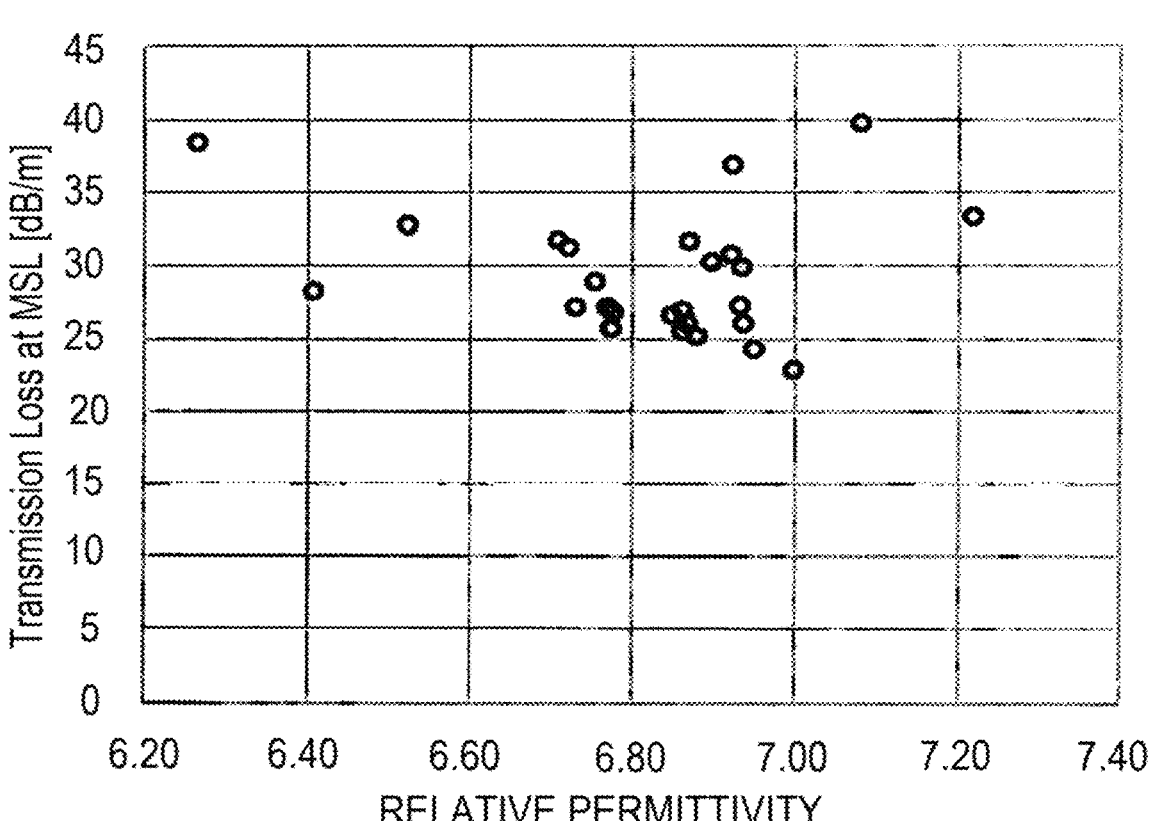
FIG. 8 is a graph plotting a relation between a relative permittivity and a transmission loss in the photosensitive glass of Example.
Figure 9:
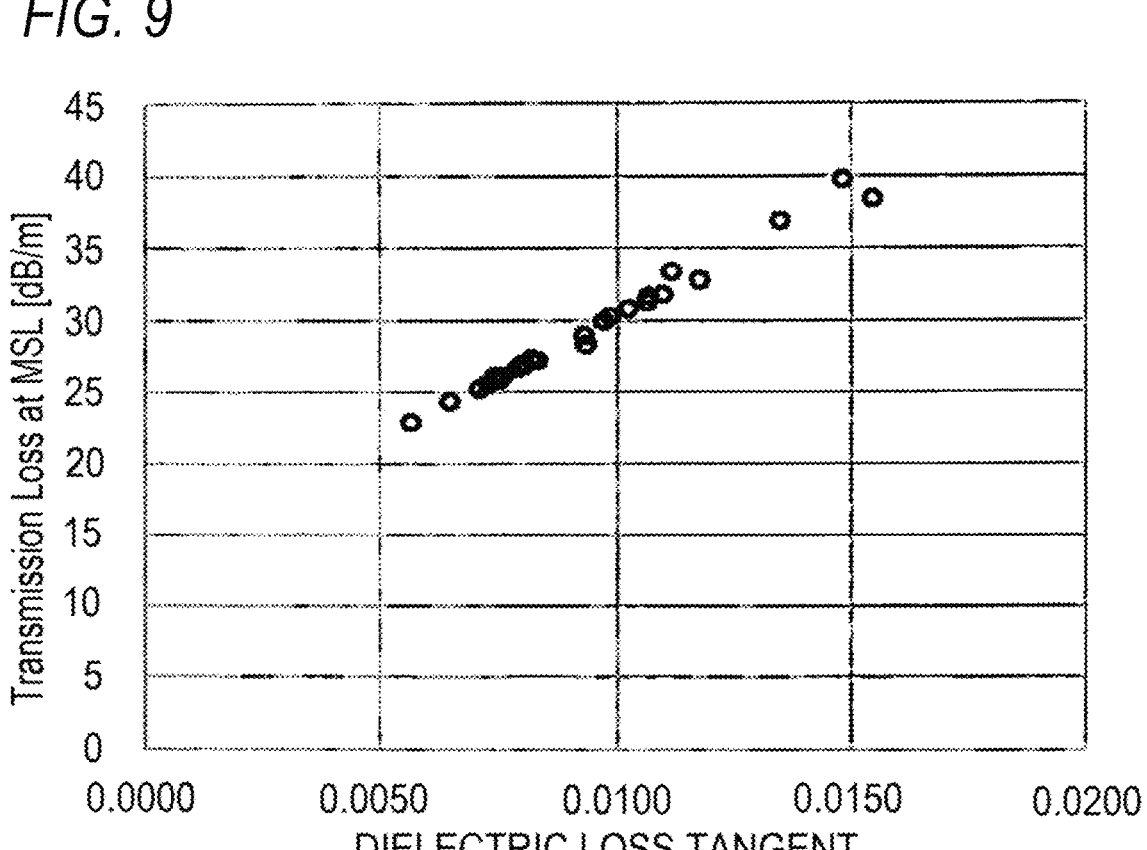
FIG. 9 is a graph plotting a relation between a dielectric loss tangent and the transmission loss in the photosensitive glass of Example.

When the produced glass was actually used as a substrate for a high-frequency device, the transmission loss of the transmission line was calculated in order to confirm a degree of influence of the transmission loss of a high-frequency signal due to the dielectric properties. The transmission line was a microstrip line (MSL). TXLINE (Cadence) was used as an analysis software. An analysis model is as follows. A copper wiring layer formed on one main surface of the glass substrate was defined to have a wiring width (shown in Tables 15 to 18) at which a property impedance of the microstrip line was 500, and the transmission loss at 10 GHz was calculated. Further, the calculation was performed assuming that a thickness of the glass, which was the dielectric layer, was 0.125 mm, and a thickness of the copper wiring layer, which was the conductor layer, was 18 μm. A surface roughness of the copper wiring layer was set to be sufficiently smooth so that a skin effect would not be a problem. The relative permittivity and the dielectric loss tangent of the glass at 20° C. and 10 GHz were used in the calculation and analysis. The relative permittivity and the dielectric loss tangent of the glass used at this time are actually measured values that were actually produced and measured. The calculated transmission losses are shown in Tables 15 to 18. A magnitude of the transmission loss with respect to the relative permittivity and the dielectric loss tangent of the glass is shown in FIGS. 8 and 9.

TABLE 15

| | Glass 1 | Glass 2 | Glass 3 | Glass 4 | Glass 5 | Glass 6 | Glass 7 |
|---|---|---|---|---|---|---|---|
| Dk @ 10 GHz | 6.88 | 6.86 | 6.78 | 6.87 | 6.78 | 6.86 | 6.85 |
| Df @ 10 GHz | 0.0071 | 0.0073 | 0.0075 | 0.0076 | 0.0081 | 0.0081 | 0.0079 |
| Transmission loss @ 10 GHz (dB/m) | 25 | 25 | 26 | 26 | 27 | 27 | 27 |
| Wiring width (µm) | 154 | 154 | 156 | 154 | 156 | 154 | 154 |

TABLE 16

| | Glass 8 | Glass 9 | Glass 10 | Glass 11 | Glass 12 | Glass 13 | Glass 14 |
|---|---|---|---|---|---|---|---|
| Dk @ 10 GHz | 6.77 | 6.73 | 6.71 | 7.22 | 7.08 | 6.93 | 6.87 |
| Df @ 10 GHz | 0.0083 | 0.0084 | 0.0110 | 0.0112 | 0.0149 | 0.0135 | 0.0107 |
| Transmission loss @ 10 GHz (dB/m) | 27 | 27 | 32 | 33 | 40 | 37 | 32 |
| Wiring width (µm) | 156 | 157 | 157 | 147 | 150 | 153 | 154 |

TABLE 17

| | Glass 15 | Glass 16 | Glass 17 | Glass 18 | Glass 19 | Glass 20 | Glass 21 |
|---|---|---|---|---|---|---|---|
| Dk @ 10 GHz | 6.93 | 6.72 | 6.92 | 6.90 | 6.53 | 6.27 | 6.76 |
| Df @ 10 GHz | 0.0097 | 0.0107 | 0.0102 | 0.0099 | 0.0118 | 0.0155 | 0.0093 |
| Transmission loss @ 10 GHz (dB/m) | 30 | 31 | 31 | 30 | 33 | 38 | 29 |
| Wiring width (µm) | 153 | 157 | 153 | 153 | 161 | 167 | 156 |

TABLE 18

| | Glass 22 | Glass 23 | Glass 24 | Glass 25 | Glass 26 |
|---|---|---|---|---|---|
| Dk @ 10 GHz | 6.41 | 7.00 | 6.95 | 6.94 | 6.93 |
| Df @ 10 GHz | 0.0094 | 0.0057 | 0.0065 | 0.0075 | 0.0082 |
| Transmission loss @ 10 GHz (dB/m) | 28 | 23 | 24 | 26 | 27 |
| Wiring width (µm) | 164 | 151 | 152 | 152 | 153 |

FIG. 8 is a graph plotting the relative permittivity of the glass on the horizontal axis and the transmission loss of the glass on the vertical axis. FIG. 9 is a graph plotting the dielectric loss tangent of the glass on the horizontal axis and the transmission loss of the glass on the vertical axis. From these figures, it can be seen that the dielectric loss tangent of the glass used as the substrate makes a greater contribution to improving the transmission loss than the relative permittivity of the glass used as the substrate. That is, it is possible to produce a high-frequency device having a smaller transmission loss by using a glass substrate having a low dielectric loss tangent. Accordingly, it was confirmed from the calculation and analysis that the dielectric loss was improved when the photosensitive glass having improved dielectric loss tangent was used for the substrate as compared with the existing photosensitive glass.

Test Example 3: Effect Due to Difference in First Temperature Range [Nucleation Temperature]

A difference when the photosensitive glass is held at 485° C. and 520° C. in the first temperature range [nucleation temperature] after exposure will be described. The compositions of glass X used are shown in Table 19 in terms of mole percentage and mass percentage. The exposure condition and the heat treatment conditions are shown in Table 20.

TABLE 19

| Glass X | mol % | wt % |
|---|---|---|
| $SiO_2$ | 68.6 | 70.7 |
| $Al_2O_3$ | 1.8 | 3.2 |

TABLE 19-continued

| Glass X | mol % | wt % |
|---|---|---|
| $B_2O_3$ | 0.6 | 0.7 |
| $Li_2O$ | 16.5 | 8.4 |
| $Na_2O$ | 5.5 | 5.8 |
| $K_2O$ | 5.5 | 8.9 |
| ZnO | 1.4 | 1.9 |
| $Sb_2O_3$ | 0.037 | 0.187 |
| $CeO_2$ | 0.003 | 0.009 |
| $Ag_2O$ | 0.029 | 0.117 |

TABLE 20

| | | | Condition 1 | | | |
|---|---|---|---|---|---|---|
| Exposure amount $(J/cm^2)$ | 0 | 0.1 | 0.5 | 1 | 4 | 10 |
| Heat treatment temperature (holding temperature in first temperature range) | | | | 485 | | |
| Heat treatment time (h) | | | | 5 | | |
| | | | Condition 2 | | | |
| Exposure amount $(J/cm^2)$ | 0 | 0.1 | 0.5 | 1 | 4 | 10 |
| Heat treatment temperature (holding temperature in first temperature range) | 520 | | | | 520 | |
| Heat treatment time (h) | 5 | | | | 5 | |

The exposure method and the transmittance measurement were performed in the same manner as in Test Example 2.

Figure 10:
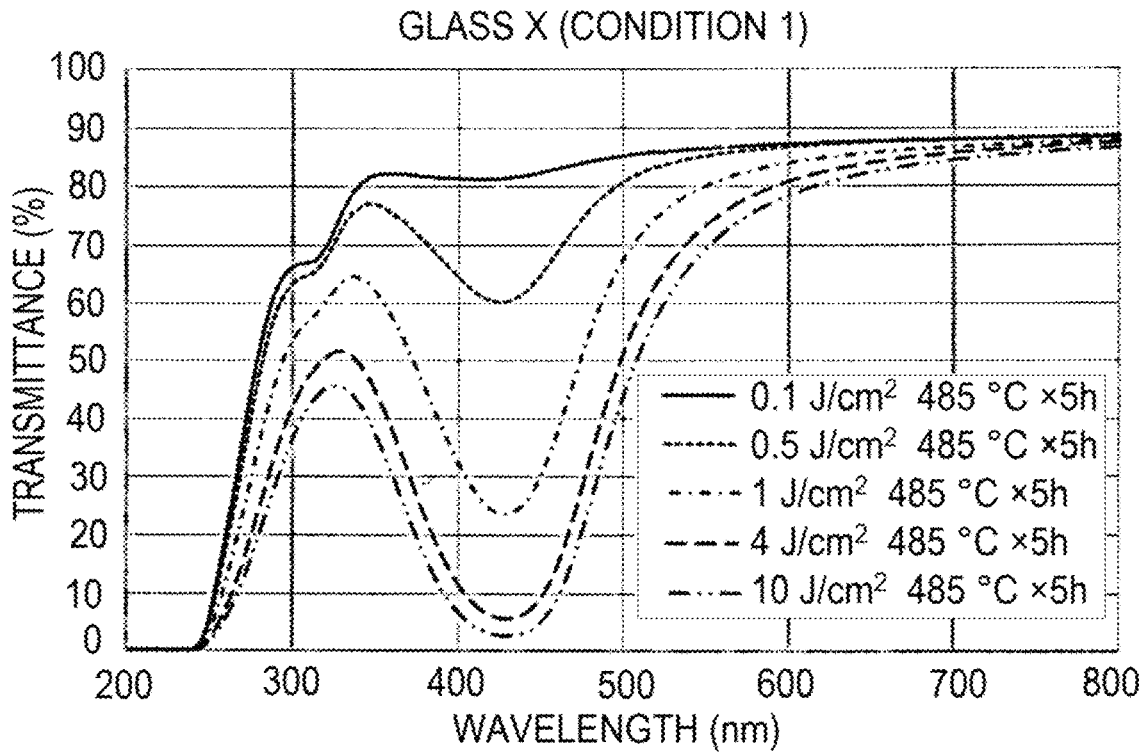
FIG. 10 is a graph showing a transmittance when exposing and heat-treating glass X under condition 1.
Figure 11:
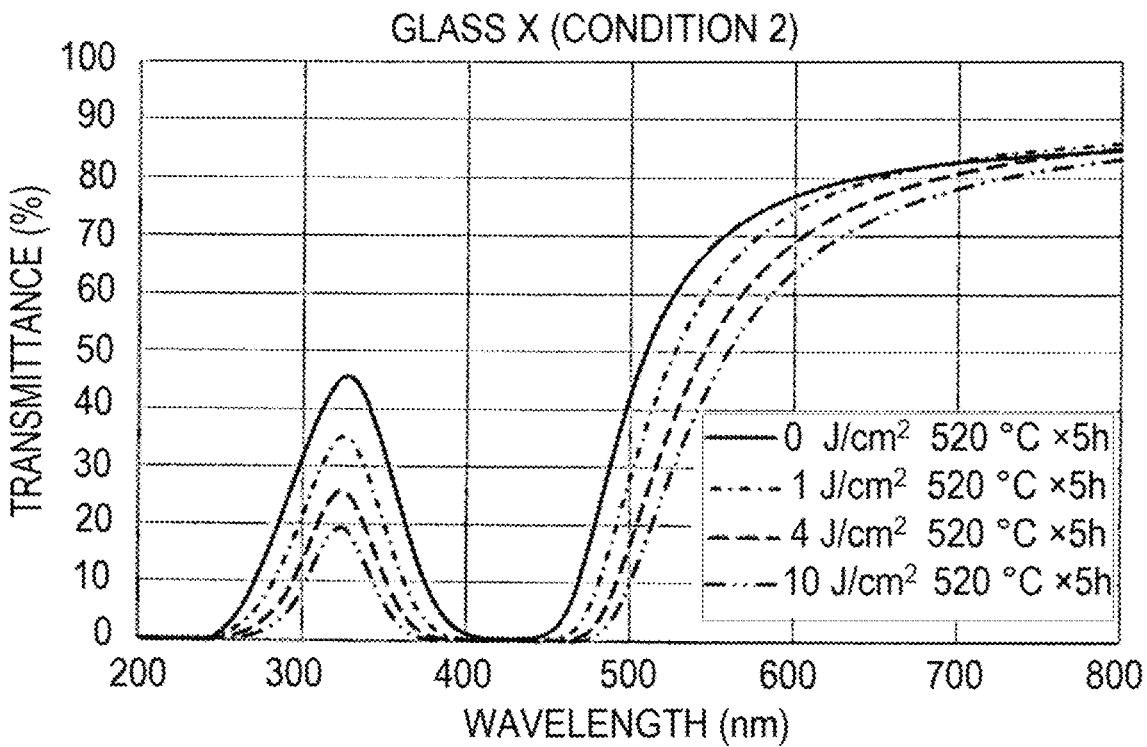
FIG. 11 is a graph showing a transmittance when exposing and heat-treating glass X under condition 2.

FIGS. 10 to 11 are graphs showing the transmittance (1 mmt converted value) of the glass X according to the exposure amount. FIG. 10 shows the transmittance when the exposure and the heat treatment were performed under Condition 1 in Table 20, and FIG. 11 shows the transmittance when the exposure and the heat treatment were performed under Condition 2 in Table 20. The transmittance shown at this time is a value converted into a transmittance corresponding to a thickness of 1 mmt by the following Formula (3).

[Math. 11]

$$T' = (1-\rho)^2 \times \left\{ \frac{T}{(1-\rho)^2} \right\}^L \qquad (3)$$

T': transmittance (1 mmt converted value), T: measured value of transmittance, ρ: reflectance, L: thickness of glass (mmt)

In FIGS. 10 to 11, it can be seen that around 430 nm is a region where the silver colloid has an absorption peak, and the transmittance at 430 nm becomes low after the heat treatment, indicating that the silver colloid is generated. Furthermore, when comparing FIG. 10 and FIG. 11, it can be seen that the transmittance at 430 nm is smaller in FIG. 11 where the holding temperature in the first temperature range is higher. This is because the generation of the silver colloid was further promoted by setting the first temperature range higher. That is, it is possible to precipitate the silver colloid in a shorter time by increasing the first temperature range to a higher temperature.

INDUSTRIAL APPLICABILITY

The photosensitive glass of the embodiment of the present invention not only has an excellent microfabrication property but also excellent dielectric loss properties for high-frequency signals. By using such photosensitive glass, it is possible to achieve a high-frequency device having a circuit substrate that is microfabricated and has excellent transmission loss properties for high-frequency signals.

Such photosensitive glass is very useful as a member of general high-frequency electronic devices that handle high-frequency signals exceeding 10 GHz, particularly high-frequency signals exceeding 30 GHz, and further high-frequency signals exceeding 35 GHz, devices involving microfabrication such as substrate integrated waveguide, or the like.

Although various embodiments have been described above with reference to the drawings, it is needless to say that the present invention is not limited to such examples. It is obvious for a person skilled in the art that various modifications and variations can be made within the category described in the scope of claims and it is understood that such modifications and variations naturally belong to the technical scope of the present invention. Further, the components described in the above embodiments may be combined in any manner without departing from the spirit of the invention.

The present application is based on Japanese Patent Application No. 2021-093783 filed on Jun. 3, 2021, the contents of which are incorporated herein by reference.

REFERENCE SIGNS LIST

1: circuit substrate
2: glass substrate
2a, 2b: main surface
3, 4: wiring layer
10: waveguide pipe
11: glass substrate
12: hollow portion

The invention claimed is:

1. A photosensitive glass in which a $Li_2SiO_3$ crystal is precipitated by exposure and heat treatment, wherein
the photosensitive glass has a value of Formula (A) described below of 0.50 or more and 0.75 or less, and
the photosensitive glass has a dielectric loss tangent at 20° C. and 10 GHz of 0.0090 or less, $$[Li_2O]/([Li_2O]+[Na_2O]+[K_2O]) \qquad \text{Formula (A)},$$

in Formula (A), $[Li_2O]$, $[Na_2O]$, and $[K_2O]$ respectively indicate contents of $Li_2O$, $Na_2O$, and $K_2O$ in the photosensitive glass in terms of mole percentage based on oxides.

2. The photosensitive glass according to claim 1, comprising:
65% to 78% of $SiO_2$ in terms of mass percentage based on oxides, wherein the photosensitive glass has a glass portion etching rate obtained by Formula (1) described below of 2.75 or less when a glass sample having a length of 30 mm×a width of 20 mm and a thickness of 0.5 mmt is immersed in 55 ml of an etching solution at 40° C. containing 5 mass % of HF and 0.7 mass % of $HNO_3$ for 4 minutes,

[Math. 1]

$$\text{etching rate} \left(\frac{\mu m}{\min}\right) = \qquad (1)$$

$$\frac{\text{weight loss (g)} \times \text{thickness of glass before testing (}\mu m\text{)}}{\text{weight of glass before testing (g)} \times \text{test time (min)}}$$

3. The photosensitive glass according to claim 1, comprising, in terms of mass percentage based on oxides:
0% to 5% (not including 5%) of $Al_2O_3$;
5% to 15% of $Li_2O$;
3% to 12% of $Na_2O$;
3% to 12% of $K_2O$;
0.3% to 8% of ZnO;
0.01% to 1% (not including 1%) of $Sb_2O_3$;
0.001% to 0.1% of $CeO_2$; and
0.05% to 1% of $Ag_2O$.

4. The photosensitive glass according to claim 1, comprising, in terms of mass percentage based on oxides:
0% to 5% (not including 5%) of $Al_2O_3$;
5% to 15% of $Li_2O$;
3% to 12% of $Na_2O$;
3% to 12% of $K_2O$;
0% to 8% of ZnO;
0.01% to 1% (not including 1%) of $Sb_2O_3$;
0.001% to 0.1% of $CeO_2$; and
0.05% to 1% of $Ag_2O$.

5. The photosensitive glass according to claim 1, comprising:
0% to 8% of $B_2O_3$ in terms of mass percentage based on oxides.

6. The photosensitive glass according to claim 1, having a relative permittivity at 20° C. and 10 GHz of 7.5 or less.

7. A glass in which a $Li_2SiO_3$ crystal is precipitated by exposing and heat-treating the photosensitive glass according to claim 1.

8. A glass in which a microstructure is formed by exposing, heat-treating, and etching the photosensitive glass according to claim 1.

9. A circuit substrate comprising an insulating substrate containing the glass according to claim 8.

10. The circuit substrate according to claim 9, which is used for a high-frequency device.

11. The circuit substrate according to claim 10, comprising a transmission line.

12. The circuit substrate according to claim 11, wherein the transmission line is a waveguide, a substrate integrated waveguide (SIW), or a microstrip line.

13. The circuit substrate according to claim 11, having a function of a passive device.

14. A high-frequency device comprising the circuit substrate according to claim 9.

15. A manufacturing method of a glass in which a microstructure is formed, the method comprising:
a step of exposing the photosensitive glass according to claim 1;
a step of precipitating a $Li_2SiO_3$ crystal by heat-treating the exposed photosensitive glass; and
a step of removing the precipitated $Li_2SiO_3$ crystal by etching treatment.

16. The manufacturing method according to claim 15, wherein
the heat treatment comprises holding in a first temperature range and holding in a second temperature range,
the first temperature range is 400° C. or higher and 500° C. or lower, and a holding time in the first temperature range is 15 minutes or longer, and
the second temperature range is 500° C. or higher and 700° C. or lower, and a holding time in the second temperature range is 15 minutes or longer.

17. The manufacturing method according to claim 15, wherein
the heat treatment comprises holding in a first temperature range and holding in a second temperature range,
the first temperature range is 400° C. or higher and 600° C. or lower, and a holding time in the first temperature range is 1 minute or longer, and
the second temperature range is (the first temperature range+5° C.) or higher and (the first temperature range+300° C.) or lower, and a holding time in the second temperature range is 1 minute or longer.

18. The photosensitive glass according to claim 1, having a transmittance (1 mmt converted value) at 430 nm of 4% or more when exposed at an exposure amount of 0.5 J/cm$^2$ and heat-treated at 485° C. for 5 hours.

19. The photosensitive glass according to claim 1, wherein
regarding a transmittance (1 mmt converted value) at 430 nm measured when exposed at an exposure amount of 1 J/cm$^2$ to 10 J/cm$^2$ and heat-treated at 485° C. for 5 hours, when plotted on a coordinate plane in which the exposure amount is set as a horizontal axis (J/cm$^2$) and the transmittance is set as a vertical axis (%), a slope of the transmittance (1 mmt converted value) at 430 nm, which is obtained by Formula (4) described below, is −0.12 or less with respect to the exposure amount of 1 J/cm$^2$ to 10 J/cm$^2$,

[Math. 2]

$$\text{slope} = \frac{\sum (X - \text{sample average of } X)(Y - \text{sample average of } Y)}{\sum (X - \text{sample average of } X)^2}, \qquad (4)$$

where X indicates the exposure amount (J/cm$^2$), and Y indicates the transmittance (1 mmt converted value) at 430 nm.

* * * * *